(12) United States Patent
Hubbard et al.

(10) Patent No.: US 6,451,120 B1
(45) Date of Patent: Sep. 17, 2002

(54) APPARATUS AND METHOD FOR BATCH PROCESSING SEMICONDUCTOR SUBSTRATES IN MAKING SEMICONDUCTOR LASERS

(75) Inventors: Kevin J. Hubbard, Vadnais Heights, MN (US); Mark McElhinney, Vadnais Heights, MN (US); Scott W. Priddy, St. Paul, MN (US); Paul E. Colombo, St. Paul, MN (US)

(73) Assignee: ADC Telecommunications, Inc., Eden Prairie, MN (US)

( * ) Notice: Subject to any disclaimer, the term of this patent is extended or adjusted under 35 U.S.C. 154(b) by 0 days.

(21) Appl. No.: 09/667,068

(22) Filed: Sep. 21, 2000

(51) Int. Cl.⁷ .............................. C23C 16/00; B26F 3/00
(52) U.S. Cl. ................................ 118/719; 118/723 VE; 118/33; 225/6; 225/23; 225/51; 225/82; 225/93; 148/DIG. 28
(58) Field of Search .......................... 118/33, 715, 719, 118/723 VE; 438/33, 68, 113, 114, 460, 465; 225/6, 23, 51, 82, 93, 98; 148/DIG. 28

(56) References Cited

U.S. PATENT DOCUMENTS

| | | | | |
|---|---|---|---|---|
| 5,063,173 A | * | 11/1991 | Gasser et al. | 148/DIG. 65 |
| 5,144,634 A | * | 9/1992 | Gasser et al. | 372/49 |
| 5,339,326 A | * | 8/1994 | Tsujimura et al. | 372/49 |
| 5,413,956 A | * | 5/1995 | Watanabe et al. | 148/DIG. 104 |
| 5,665,637 A | * | 9/1997 | Chand | 372/46 |
| 5,773,318 A | * | 6/1998 | Chand et al. | 225/2 |
| 6,323,052 B1 | * | 11/2001 | Horie et al. | 438/22 |

FOREIGN PATENT DOCUMENTS

JP  10-125994  * 5/1998

* cited by examiner

Primary Examiner—Jeffrie R. Lund
(74) Attorney, Agent, or Firm—Kagan Binder, PLLC

(57) ABSTRACT

An apparatus and method for batch processing semiconductor lasers producing substantially contamination free laser bar end surfaces for optimal growth of end surface layers are provided. The method includes loading a laser cell comprising a plurality of laser bars and an empty cassette capable of holding a plurality of laser bars into a cleaving chamber and pumping the cleaving chamber down to a desired pressure. Next, a cleaving cycle is performed in which an end laser bar is cleaved off the laser cell. The laser bar is deposited in the cassette, while the laser cell is positioned for a subsequent operation. The cleaving cycle repeats until a plurality of laser bars are cleaved off the laser cell and loaded into the cassette. The cassette is then moved into a deposition chamber where a layer of material is deposited on at least one end surface of all of the laser bars in the cassette.

23 Claims, 18 Drawing Sheets

APPARATUS AND METHOD FOR BATCH PROCESSING SEMICONDUCTOR SUBSTRATES IN MAKING SEMICONDUCTOR LASERS

FIELD OF THE INVENTION

This invention relates generally to an apparatus and method utilized in the process of manufacturing semiconductor lasers. More particularly, the invention relates to an apparatus and method that permits batch processing of the semiconductor lasers so as to speed up the manufacturing process for semiconductor lasers, and also provide improved device characteristics and a longer lifetime for high power applications.

BACKGROUND OF THE INVENTION

In recent years, semiconductor lasers have found a number of technological applications, including optical communications systems, optical storage systems, and laser printers. Semiconductor lasers suitable for these applications are generally formed by depositing a multilayer structure on a substrate so as to form a laser cell from which a large number of lasers can be made. The laser cell is typically cleaved along parallel planes into a number of laser bars. The laser bars are subsequently cleaved into a number of individual semiconductor dies, each of which may ultimately become a semiconductor laser diode.

Generally, after the laser cell is cleaved into laser bars, and prior to cleaving into individual dies, it is common to coat a surface of the laser bars with one or more of various layers of material. Such layers of material may be used, for example, to form passivation layers or mirror layers. It may be desirable to grow one or more of these layers by molecular beam epitaxy (MBE) or other epitaxial growth techniques, in order to produce uniform layers. However, epitaxial layer growth is a very slow process that is conducted in a specialized deposition chamber that is designed based upon the growth technique. Typical deposition rates are on the order of about 1 $\mu$m/hr. Thus, the epitaxial growth of layers on each individual laser bar as they are separately provided within a deposition chamber results in prohibitively long processing times for the commercial manufacture of semiconductor lasers.

Methods for cleaving and coating semiconductor lasers are known. For example, U.S. Pat. No. 5,144,634 discloses a method for cleaving and passivating a semiconductor laser. A single laser bar comprising two scribe marks is mounted in a carrier. The laser bar is cleaved along the two scribe marks while in vacuum to form mirror surfaces which are then passivated by e-beam evaporation of a layer of amorphous silicon or the like. This process of individually cleaving and passivating the resulting facets is cumbersome, and is generally too time consuming for optimal commercial production methods.

In addition, many technological applications of semiconductor lasers require operation of the lasers at high power outputs (typically above 30 mW) for extended periods of time. The operation of semiconductor lasers at high power outputs may cause considerable dissipation of heat at the laser end surfaces, which over time can degrade these surfaces. This deterioration, termed catastrophic optical damage (COD) in the art, reduces-the stability and lifetime of the semiconductor laser. Thus, the maximum power at which a semiconductor laser can be operated for extended periods of time may be severely limited.

Applications of semiconductor lasers for communications systems require operation of the lasers at very high power outputs (typically above 100 mW) for extended periods of time. At these very high power outputs the potential for COD is significantly increased and greater care must be exercised in the formation of the laser end surfaces in order to reduce the possibility of COD.

One known way to reduce COD is through the use of "window layers" on the end surfaces of the semiconductor lasers. A window layer is a layer of material having a band gap that is significantly higher than the material forming the multilayer structure. The window layer is largely transparent to the laser light, and thus serves to lengthen the laser cavity. This reduces heat build-up on the end surfaces of the multilayer structure, and consequently reduces COD. Such window layers are typically on the order of 100–200 nm thick.

It is also known that these widow layers provide even greater protection against COD when deposited on "clean" contamination-free laser end surfaces. Thus, laser bars are cleaved in ultra-high-vacuum (i.e. in the order of $1 \times 10^{-8}$ torr or better) to achieve contamination-free mirror surfaces, which mirror surfaces may then be provided with a window or passivation layer. Unfortunately, creating the ultra-high-vacuum environment necessary to create contamination-free laser end surfaces is also a slow process. Using methods well known to the art to create or pump down to such high levels of vacuum, i.e. better than $1 \times 10^{-9}$ torr with partial pressures of oxygen and water better than $1 \times 10^{-12}$ torr, require at least 12 hours to achieve and typically require 24 hours or more. A method of mirror passivation where a single semiconductor bar is cleaved and passivated in a vacuum chamber while at ultra-high-vacuum is disclosed in U.S. Pat. No. 5,063,173 to Gasser et al.

In addition to protection against COD, several further characteristics are desirable. Power output and maximum device lifetime are critical criteria of semiconductor lasers, especially for use in communications systems. The formation of the window layers as a single crystal on laser end surfaces provides excellent protection against COD, while producing superior device characteristics (e.g., power output and stability). However, as explained above, creating ultra-high-vacuum levels for making contamination-free laser bar end surfaces and the subsequent growth of a single crystal layer on the end surfaces is necessarily a very slow total process. For example, the growth stage of a 100–200 nm single crystal film takes at least 30 minutes. One or more such layers may be desirable that may need to be separately grown on more than one mirror surface. This is in addition to the time required to achieve ultra-high-vacuum levels as noted above. This total time requirement essentially prohibits the growth of single crystal layers on individual semiconductor lasers in ultra-high-vacuum as a production tool.

Finally, the prior art passivation and window layers generally serve no usefulness as part of the mirror stack for the laser. Thus, after application of the passivation and/or window layers, it is still necessary to add multiple layers of amorphous material to each end surface so as to adjust the reflectivity of the surfaces.

SUMMARY OF THE INVENTION

The present invention overcomes the disadvantages and shortcomings of the prior art by providing an apparatus and method for batch processing a plurality of semiconductor laser bars allowing for simultaneous growth of layers of material on laser bar end surfaces. Batch processing a plurality of semiconductor laser bars not only speeds up the production process, but enables incorporation of the growth of single crystal layers on the laser end surfaces in production processes, yielding enhanced protection against COD and improved laser improved device characteristics.

Also, by the present invention, a method for producing semiconductor lasers is provided with improved protection against COD and superior device characteristics, including long lifetimes, high power outputs, and improved stability.

The present invention includes a method for batch processing one or more semiconductor laser cells, each comprising a multilayer structure formed on a substrate, in vacuum. The process includes the steps of cleaving a plurality of semiconductor laser bars from one laser cell and then depositing a layer of material on an end surface of each of the semiconductor laser bars simultaneously. Batch processing a plurality of semiconductor laser bars substantially reduces the average growth time per individual laser bar, thus making feasible the commercial processing of semiconductor lasers coated with end surface layers.

The method of the present invention is particularly useful in the formation of single crystal high band gap mirror layers on the laser end surfaces, wherein relatively thick mirror layers made of a single crystalline layer can be grown on a plurality of laser bars simultaneously. This permits the mass production of semiconductor lasers with improved device characteristics (e.g., higher power outputs and improved stability) and enhanced protection against COD relative to the conventional use of lasers comprising polycrystalline protective layers.

The present invention also includes an apparatus for batch processing semiconductor lasers. The apparatus includes a vacuum chamber and a pump which preferably reduces the pressure in the vacuum chamber to below $1 \times 10^{-8}$ Torr (that is, preferably to the level of ultra-high-vacuum). A support structure is provided within the vacuum chamber for supporting at least one laser cell thereon. A laser cell clamp is preferably mounted within the vacuum chamber to be positionable so as to hold a laser bar located along an edge of the laser cell at a desired cleaving position. A cleave bar that is operatively supported as well within the vacuum chamber is movable relative to the laser cell clamp, so that the motion of the cleave bar causes the laser bar located along the edge of the laser cell to be cleaved from the laser cell. After one cleaving operation, the laser cell clamp can be released to permit the laser cell to be repositioned so that a next laser bar position of the laser cell can be positioned for a next cleaving operation. Repositioning of the laser cell may be caused by gravity and or by the application of an additional force. Preferably, the support structure for the laser cell includes a stop to define the cleaving position of a laser bar portion. A cassette is preferably also provided which is operatively positioned to receive a plurality of laser bars after they are cleaved from the laser cell. The cassette also preferably positions and holds the laser bars such that at least one of the side surfaces of each of the laser bars is substantially exposed. A deposition source is then used to deposit a layer of material on the exposed side surface(s) of all of the laser bars simultaneously. More than one such layering process may be conducted as desired.

The cassette preferably holds the laser bars such that both side surfaces of the laser bars are substantially exposed. This may be accomplished by shallow slots on the cassette which retain edge portions of the laser bars while maintaining most of the side surfaces of the lasers bars exposed for depositing material thereon.

The support structure is preferably an inclined guide, which is inclined toward a cassette in position, so that the laser cell can be gravitationally indexed after each cleave. In its preferred operation, a laser cell clamp presses against the laser cell on the inclined guide, while the laser cleave bar presses against the laser bar portion that is located along the edge of the cell so as to cleave off the laser bar, which then falls gravitationally into the cassette. The laser cell clamp and cleave bar are then released, and gravity preferably causes the laser cell to move toward the cassette, so that the cleaving operation can be repeated.

DETAILED DESCRIPTION OF THE PREFERRED EMBODIMENT

The present invention is directed to methods and apparatus for cleaving laser bars from a laser cell and subsequently depositing a layer of material, such as a passivation or window layer, on one or both oppositely-facing end surfaces of a plurality of laser bars. In particular, the present invention is directed to batch processing methods and apparatus whereby at least one laser cell can be cleaved in a plurality of laser bars, which plurality of laser bars may be together subjected to a deposition operation to coat a cleaved surface of each laser bar. Preferably, as will be described in the preferred embodiment below, a plurality of laser cells may even be loaded into the apparatus so that many laser cells may be cleaved into laser bars as part of a batch process.

Figure 1:
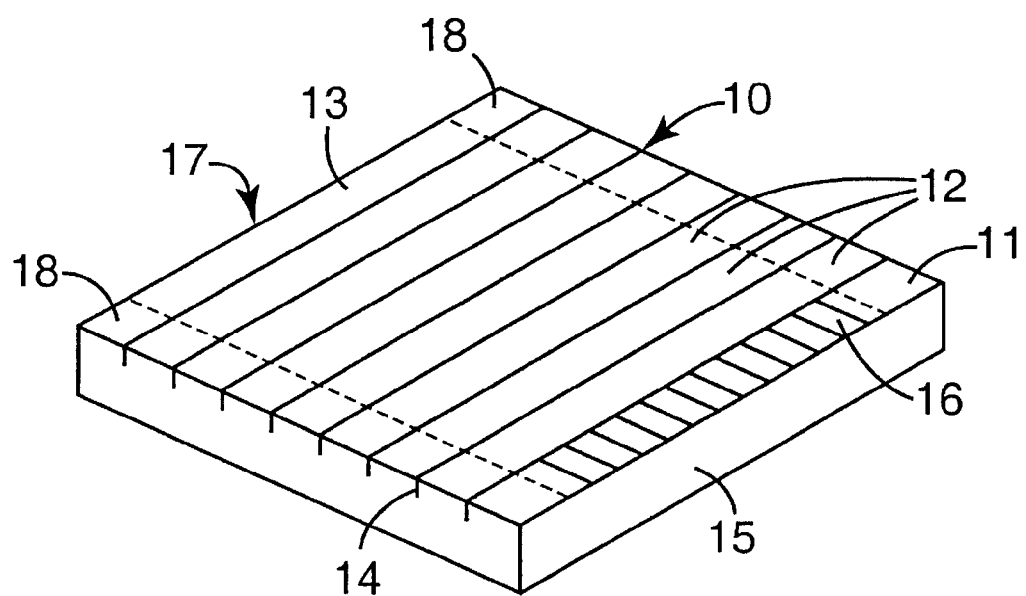
FIG. 1 illustrates a semiconductor laser cell from which a multitude of semiconductor laser bars can be cleaved by way of an apparatus and in accordance with a method of the present invention.

With reference to FIG. 1, a laser cell 10 is illustrated. A laser cell 10 is typically a portion of a layered semiconductor laser wafer from which laser bars 12 are to be cleaved. Lines 14 in FIG. 1 show where the cleaves are expected to occur with respect to the laser cell 10 so as to define a plurality of laser bars 12. A preferred laser cell is about 17 mm wide and about 0.15 mm thick and contains at least two laser bars, preferably 50 laser bars. The illustrated lines 14 are preferably actually scribe lines. A preferred laser bar 12 is about 0.75 mm wide. Each semiconductor laser bar 12 comprises at least two, and preferably many semiconductor dies 16 that each potentially may be further processed in the making of semiconductor lasers. In order to provide for handling of the laser cell 10, side regions 18 preferably will not be used in the making of any laser die. Preferably, end regions 18 of about 1.9 mm in length provide sufficient space for handling the laser bar without damaging any of the portions of laser bars 12 from which laser dies 16 will eventually be made.

Figure 2:
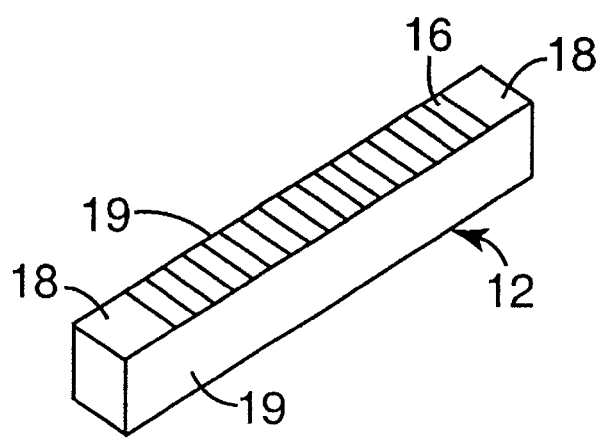
FIG. 2 illustrates a semiconductor laser bar that has been cleaved from a laser cell such as shown in FIG. 1 and which exhibits oppositely-facing facets.

FIG. 2 shows a laser bar 12 after it has been cleaved from the laser cell 10. Each laser bar 12 includes portions of the end regions 18 and a number of laser dies 16. Each laser bar 12 also comprises two oppositely-facing end surfaces 19. In the case of all of the end surfaces 19 of each laser bar 12, except for the very first laser bar 11 and last laser bar 13 of FIG. 1, will be cleaved surfaces. A leading surface 15 of first laser bar 11 and a trailing surface 17 of the last laser bar 13 comprise surfaces resulting from the making of the laser cell 10 itself. For reasons of making contamination-free laser bar facets that may be deposited with materials as described below, the first laser bar 11 and the last laser bar 13 may not actually be utilized (depending on whether or not two clean facet surfaces are desired) in making semiconductor lasers, in particular where high-power laser output requirements are needed.

Figure 3:
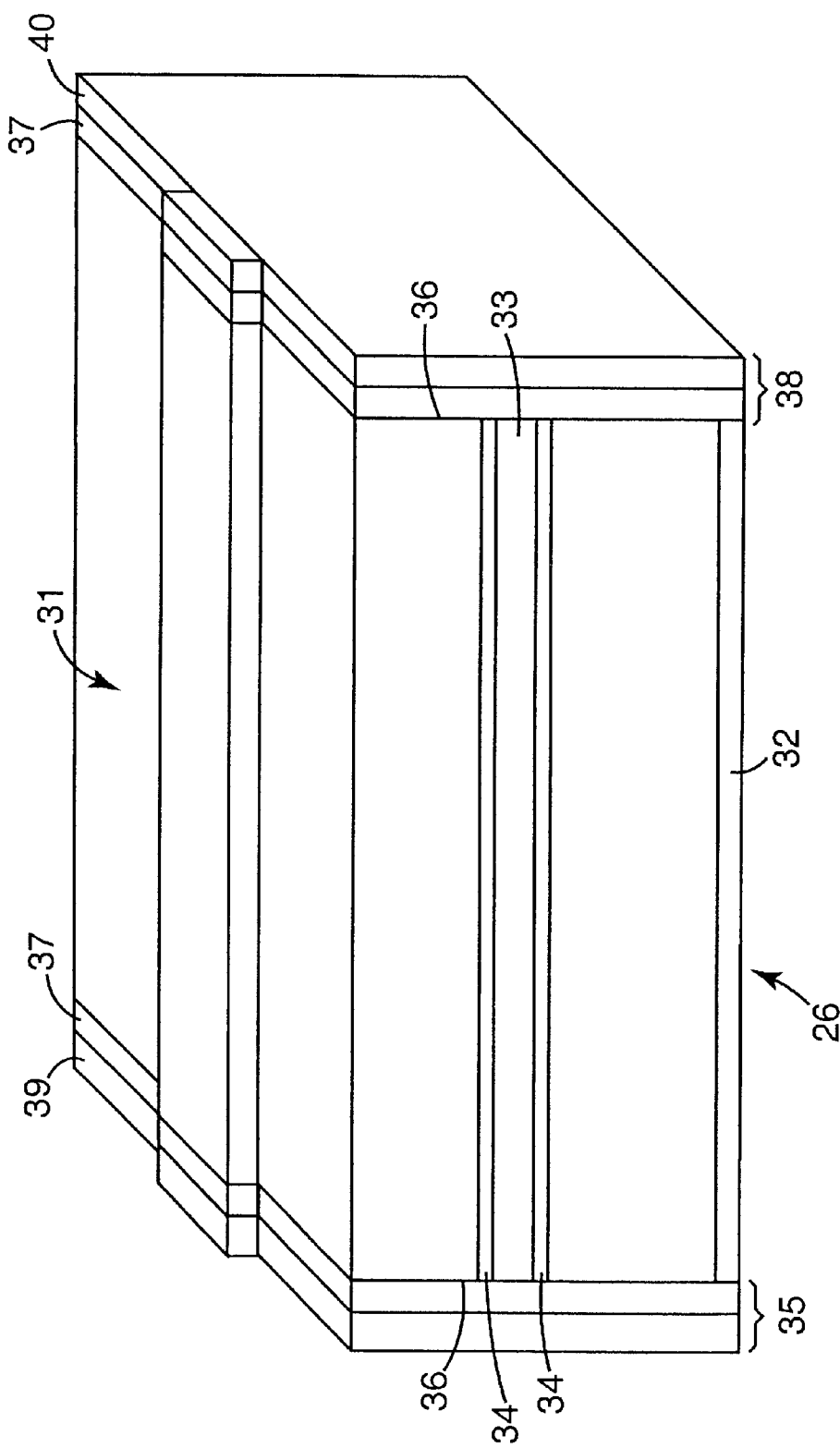
FIG. 3 is a semiconductor laser die such as can be produced from a semiconductor laser bar that has been processed in accordance with the present invention and which is further processed for use as a semiconductor laser.

FIG. 3 shows the general structure of a semiconductor laser 26 made using the apparatus and method of the preferred embodiment of the present invention. Semiconductor laser 26 comprises a multilayer structure 31 formed on a substrate 32. The details of the multilayer structure 31 are not critical to the present invention and, thus, will not be described in detail. However, the multilayer structure generally includes an optically active layer 33 surrounded by two cladding layers 34, so as to define a waveguide. The multilayer structure 31 further defines opposing end surfaces 36. The semiconductor lasers also include mirror stacks 35 and 38. Both mirror stacks preferably comprise mirror layers 37 which may comprise large band gap materials (e.g., a preferred material's energy band gap is at least 300 meV greater than that of the active layer). Thus, for example, for a 980 nm GaAs laser, the window layers may be made of ZnSe, ZnS, or BeTe, and may be about 85 nm thick. Any other such material in the art would also be suitable depending on the specific application. Because of their higher band gap energy, the window layers are generally transparent to the laser light, and thus extend the length of the laser cavity.

Mirror stacks 35 and 38 also preferably include additional mirror layers 39 and 40. These mirrors are of different reflectivity. The low reflectivity mirror 38 may comprise, for example, a single layer of $Al_2O_3$, $SiO_x$, $TiO_2$ or $Si_3N_4$ whereas the high reflectivity mirror 39 may comprises alternating layers of high and low reflectivity materials, such as including $Al_2O_3$, $SiO_x$, $TiO_2$, $Si_3N_4$ and Si. In a preferred embodiment, the constituent mirror layers are each ~$\lambda/4$ n thick, where $\lambda$ is the wavelength of the laser light, and n is the index of refraction for the layer material.

Although the apparatus and method of this invention may be used to produce high power output 980 nm GaAs lasers possessing superior device characteristics (e.g., power output, stability, and lifetime), they are equally suitable for the manufacture of other GaAs lasers, and indeed many other semiconductor lasers regardless of their operating power and wavelength. However, this invention provides the greatest benefit when used to produce high power output (e.g., $\geq 30$ mW) semiconductor lasers.

Figure 4:
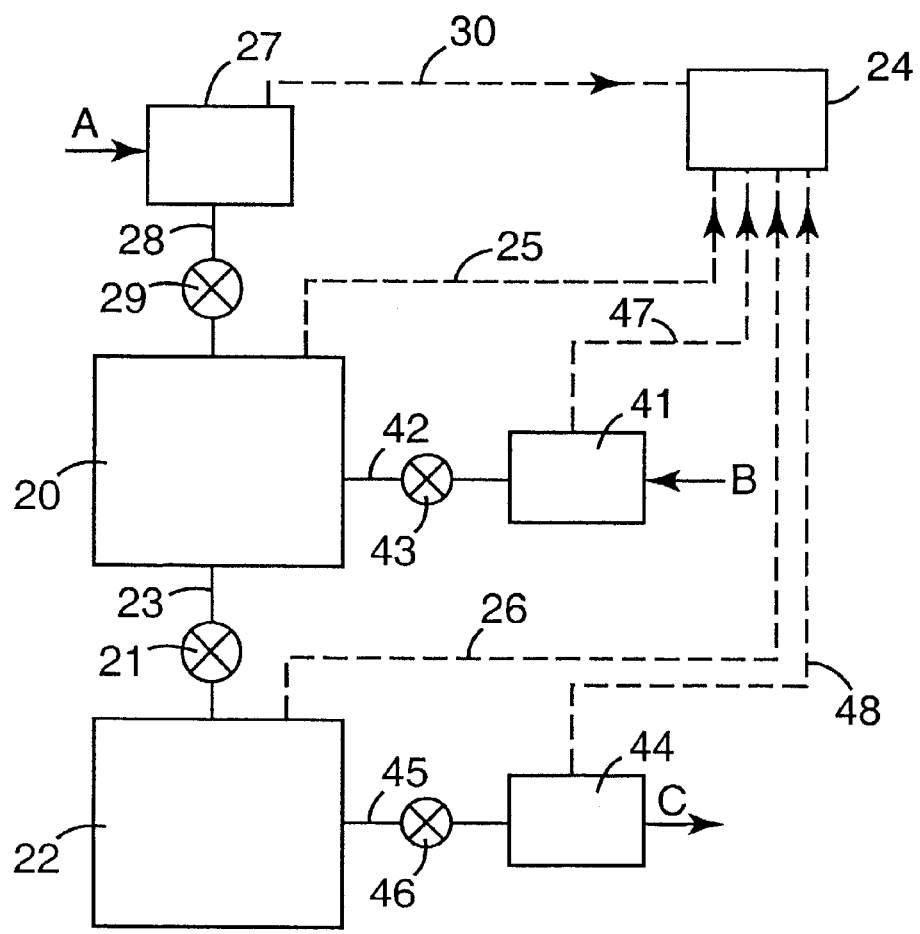
FIG. 4 is a schematic illustration of a cleaving chamber and deposition chamber in accordance with the present invention that are operatively connected with one another so that cleaved laser bars can be transferred from the cleaving chamber to the deposition chamber, and showing preferred laser cell and cassette loading chambers and a finished laser bar/cassette unloading chamber all schematically connected to a vacuum generator.

With reference to FIG. 4, an apparatus in accordance with the present invention comprises a functional cleaving chamber 20 and a reaction processing or deposition chamber 22 that are both preferably ultra-high vacuum compatible (meaning they can be provided with an ultra-high vacuum within their internal space) and which are operationally connected to one another. The vacuum level for any particular process that may be conducted in accordance with the present invention may be chosen depending on any specific application as well as a number of other factors. For example, for high power laser output applications, contamination prevention is critical, and, thus, higher vacuum levels are desirable. For many applications a level of about $1 \times 10^{-6}$ Torr may be sufficient. For others the vacuum level may be about $1 \times 10^{-8}$ Torr. For 980 nm lasers, for example, a vacuum level of $1 \times 10^{-9}$ Torr is preferred. From a contamination standpoint, or more appropriately to reduce the possibility of contamination to a facet surface, it is preferable to reduce the presence of those molecules, in particular, that may adversely affect the facet surface during laser usage. For example, it is desirable to prevent oxygen from being available to form an oxide layer to the facet surface. At a vacuum of about $1 \times 10^{-6}$ Torr, a monolayer could form on a facet surface in about one second. However, where the vacuum is greater to about $1 \times 10^{-9}$ Torr and thus there are far fewer molecules within the chamber, a monolayer could form in about $1 \times 10^4$ seconds. This advantageously provides significantly more time to permit a batch processing of laser bars in accordance with the present invention, for example, and time to transfer one or more laser bars to a deposition chamber.

A valve 21, such as a conventional gate valve, as are commercially available from VAT Incorporated of Woburn, Ma. for such use, so that product can be moved from within the cleaving chamber 20 to within the deposition chamber 22 by way of the valve 21. A single chamber may instead be used for both the cleaving and deposition operations, but separate chambers are preferred for reasons that will be apparent from the preferred functionality set out below. Valve 21 is provided within a conduit 23 to permit the transfer. A vacuum generator 24 is shown schematically connected with the interior of cleaving chamber 20 by dashed line 25 and to the interior of deposition chamber 22 by way of dashed line 26. In accordance with the preferred version of the subject invention, vacuum generator 24 is preferably capable of generating ultra-high vacuum within the interiors of cleaving chamber 20 and deposition chamber 22.

Cleaving chamber 20 is operationally connected with a laser cell loading chamber 27 by way of a conduit 28 and valve 29. The purpose of laser cell loading chamber 27 is to receive one or more laser cells as indicated by arrow A within its interior from which the laser cells may be transferred to the cleaving chamber 20 via conduit 28 when valve 29 is open. Laser cell loading chamber 27 is also preferably capable of obtaining ultra-high vacuum within its interior as it is schematically connected with the vacuum generator 24 by dashed line 30. A cassette loading chamber 41 is also preferably operationally connected with the cleaving chamber 20 by way of a conduit 42 and valve 43. Cassette loading chamber 41 is preferably provided for the purpose of permitting cassettes (which will be described in greater detail below) into the interior of cleaving chamber 20 when valve 43 permits such transfer. As will be described in greater detail below, the cassettes are provided for receiving laser bars that are cleaved from the laser cells as such operation is conducted within the cleaving chamber 20. Cassettes are introduced within the cassette loading chamber 41 as indicated at arrow B. Cassette loading chamber 41 is also preferably independently able to obtain ultra-high vacuum by the connection with vacuum generator 24 illustrated by dashed line 47.

A loadout chamber 44 is preferably also provided that is operationally connected with the deposition chamber 22 by way of a conduit 45 having a valve 46. By this arrangement, laser bars having one or more layers deposited on an end surface thereof within deposition chamber 22 may pass through conduit 45 when the valve 46 open and within the interior of loadout chamber 44. As shown by arrow C, the layered laser bars may be removed from the apparatus for further processing. Loadout chamber 44 is also preferably capable of achieving ultra-high vacuum under the influence of vacuum generator 24 as operationally connected by the dashed line 48.

By the above arrangement, it is possible to independently achieve whatever vacuum level is desired, preferably ultra-high vacuum within each of the cleaving chamber 20, deposition chamber 22, laser cell loading chamber 27, cassette loading chamber 41 and loadout chamber 44. Illustrated is a single vacuum generator 24, but it is understood that multiple devices or systems may be utilized that are selectively controllable in any way. Valves 21, 29, 43 and 46 ensure that each of the aforementioned chambers may be selectively isolated from each of the others. That is, each chamber 20, 22, 27, 41 and 44 may alone be provided with a desired vacuum level and/or vented to ambient air.

In particular, valve 21 permits transfer of cleaved laser bars from cleaving chamber 20 to the deposition chamber 22. During a cleaving operation, it may be desirable to have valve 21 closed so that the deposition chamber 22 may be performing an independent deposition operation or may be being prepared to achieve a desired vacuum level during the cleaving operation within cleaving chamber 20. During a cleaving operation, valves 29 and 43 would likely also be closed during a cleaving operation. However, as long as valves 29 and 43 are closed, chambers 27 and 41 may be vented, loaded or in the process of being pumped down to a desired vacuum level.

Likewise, during deposition within the deposition chamber 22, with valves 21 and 46 closed, deposition may be occurring while product is loaded out of chamber 44, or chamber 44 may be vented or being brought down to appropriate vacuum. As above, the deposition may be done independently from that which is occurring in cleaving chamber 20 and its associated chambers 27 and 41.

A benefit in this arrangement lies in that it takes so long to achieve ultra-high vacuum levels within each of these chambers. As set out in the Background section above, it can take from 12 to 24 hours to achieve ultra-high vacuum level. The time depends, in part, on the interior volume of the respective chambers. Thus, it is preferable that the loading and loadout chambers 27, 41 and 44 be as small as practical to permit their basic functionality and to permit product/device transfer as required. The cleaving chamber 20 and deposition chamber 22 can theoretically be brought to the desired vacuum level but once and thereafter be maintained at the desired vacuum level since all venting would be done within the other chambers 27, 41 and 44. This is very beneficial in the production of semiconductor laser bars in that very high vacuum levels may be achieved and maintained so as to reduce the possibility of contaminants within the cleaving chamber 20 and deposition chamber 22 without the need to spend the time to achieve the desired vacuum level for each production run. Moreover, by conducting a batch processing cleaving and deposition operation as will be described below, in such an arrangement where the cleaving chamber 20 and deposition chamber 22 may be maintained at the desired vacuum level, significantly greater production quantities are obtainable.

Figure 5:
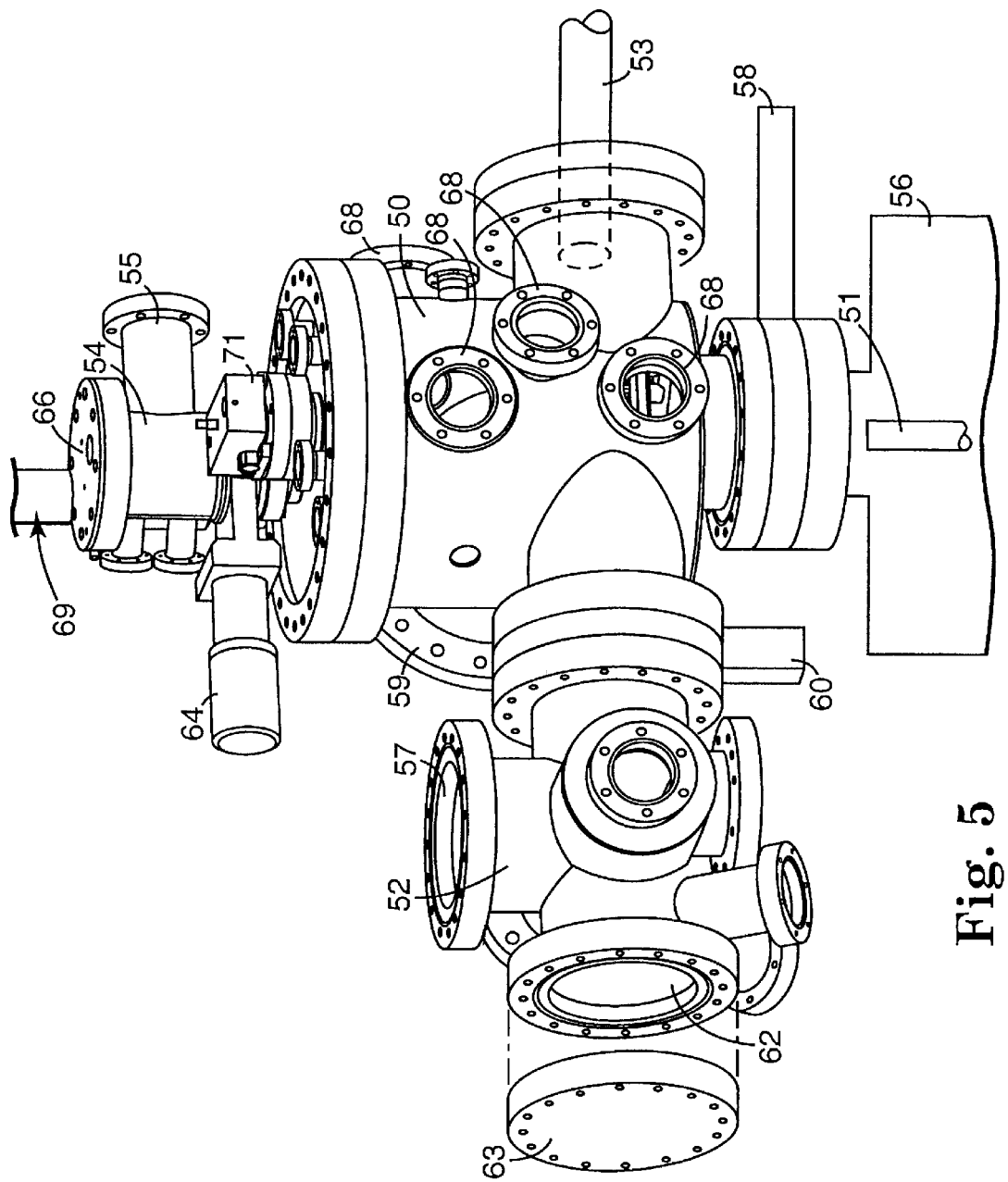
FIG. 5 is a partially exploded ultra-high-vacuum cleaving chamber, cassette loading chamber and laser cell loading chamber in accordance with a preferred embodiment of the present invention that are schematically connected with a deposition chamber.

A preferred arrangement for an Ultra-High-Vacuum ("UHV") cleaving chamber, a cassette loading chamber, and a laser cell loading chamber for the apparatus for cleaving and loading a plurality of laser bars into a cassette for batch processing is shown in FIG. 5. As shown therein, the arrangement includes a UHV compatible-cleaving chamber 50, a cassette loading chamber 52, and a cell loading chamber 54. In the preferred embodiment, the cleaving chamber 50 is operationally connected to a deposition chamber 56 via a gate valve 58. Generally speaking, a gate valve is used to isolate two chambers when one of the chambers is vented. The specific components that are typically placed within a deposition chamber are well known to those skilled in the art, and will not be discussed in detail herein. Optical access ports 68 may be provided on the cleaving chamber 50. Ports 68 allow one to be apprised of the progress of the cleaving cycle. The cassette loading chamber 52 is attached to the cleaving chamber via a gate valve 60. A port 62 is provided on the cassette loading chamber to load at least one cassette. Port 62 is covered by a cover plate 63 that can be removably used to open and close the port 62. As is the case with all connected components for such vacuum chambers, suitable seals are also preferable. Where UHV is desired, such seals must be effective to prevent fluid flow, but also to withstand the temperatures that are typically experienced when baking such components as part of the pump-down process to drive away water, in particular. Such suitable sealing materials and techniques are known. Any number of cassettes may be loaded depending on the inside volume of chamber 52; at least four are preferably accommodated. The cell loading chamber 54 is attached to the cleaving chamber via a gate valve 64. A port 66 is provided on the cell loading chamber 54 to load at least one cell. Preferably, as many as eight cells may be loaded within chamber 54.

A pump or series of pumps (not shown) are provided to achieve a clean environment (e.g., a pressure below about $1 \times 10^{-9}$ Torr where the partial pressure of both oxygen and water are below about $1 \times 10^9$ Torr) for the production of clean, smooth laser bar end surfaces. Preferably, the pumps comprise oil-free pumps to eliminate back streaming of oil vapor into the cleaving chamber, such as oil-free cryopumps, magnetic bearing turbo pumps, ion pumps, and other UHV pumps well known to those skilled in the art. For example CT-8 model pumps commercially available from CTI-Cryogenics of Helix Technology Corporation of Mansfield, Ma. are suitable. A pump or pump system can be fluidly connected with cell loading chamber 54 by way of port 55. Likewise, cassette loading chamber 52 and cleaving chamber 50 may be connected to the pump or pumps via ports 57 and 59, respectively.

The use of loading chambers 52 and 54 substantially reduce the overall processing time because the adjoining cleaving chamber 50 may be maintained at UHV conditions throughout the processing of many laser cells. Due to the loading chamber's small volume and minimal surface area, the pump down time for the loading chamber is substantially less than that for the cleaving chamber 50, resulting in a greatly reduced processing time for a plurality of laser cells.

Figure 6:
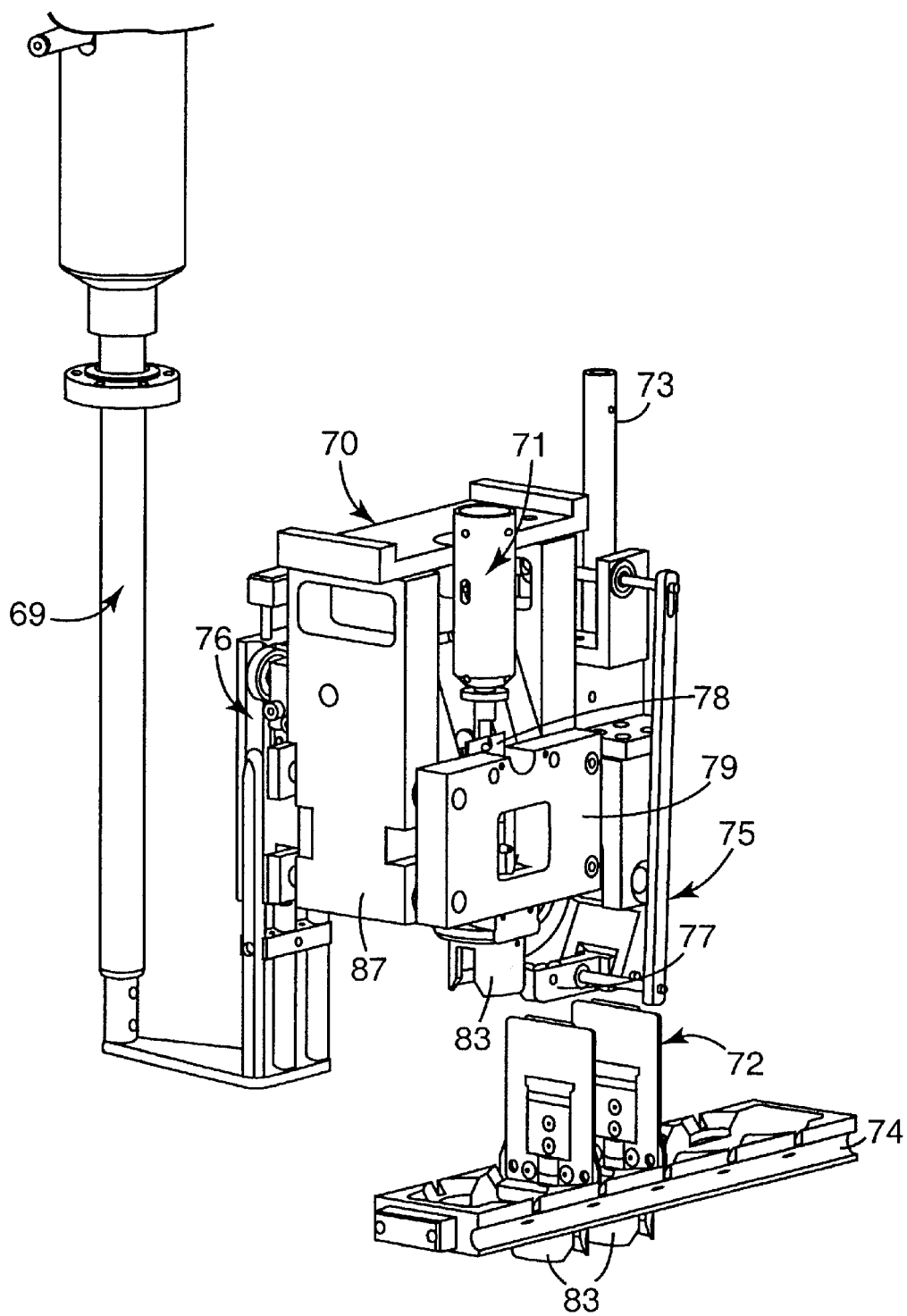
FIG. 6 is a perspective view of a support and cleaving mechanism of a preferred embodiment of the present invention for supporting a plurality of laser cells, feeding a laser cell into a cleaving mechanism, and positioning a cassette for loading with cleaved laser bars.
Figure 7:
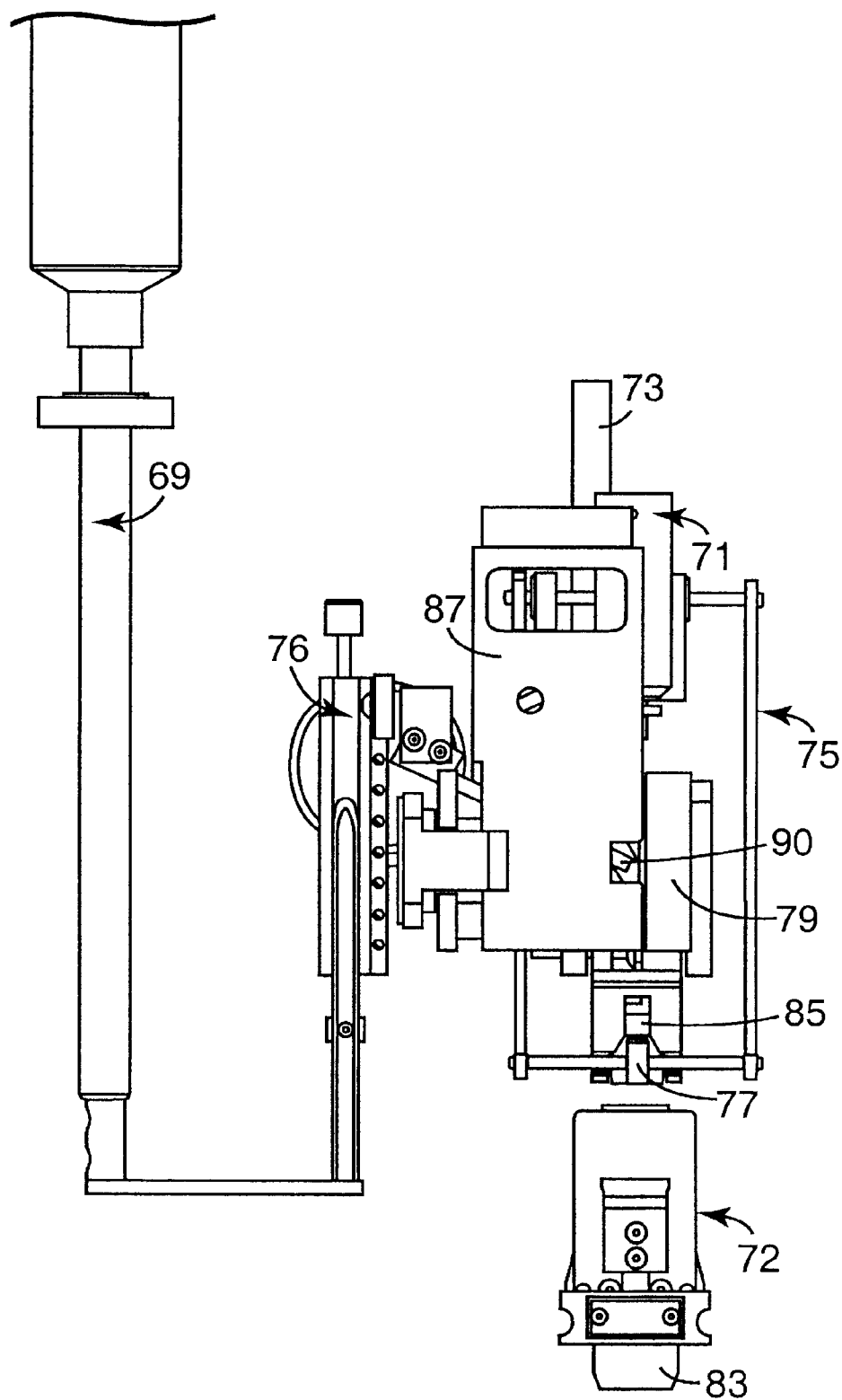
FIG. 7 is a left side view of the supporting and cleaving mechanism of FIG. 6.
Figure 8:
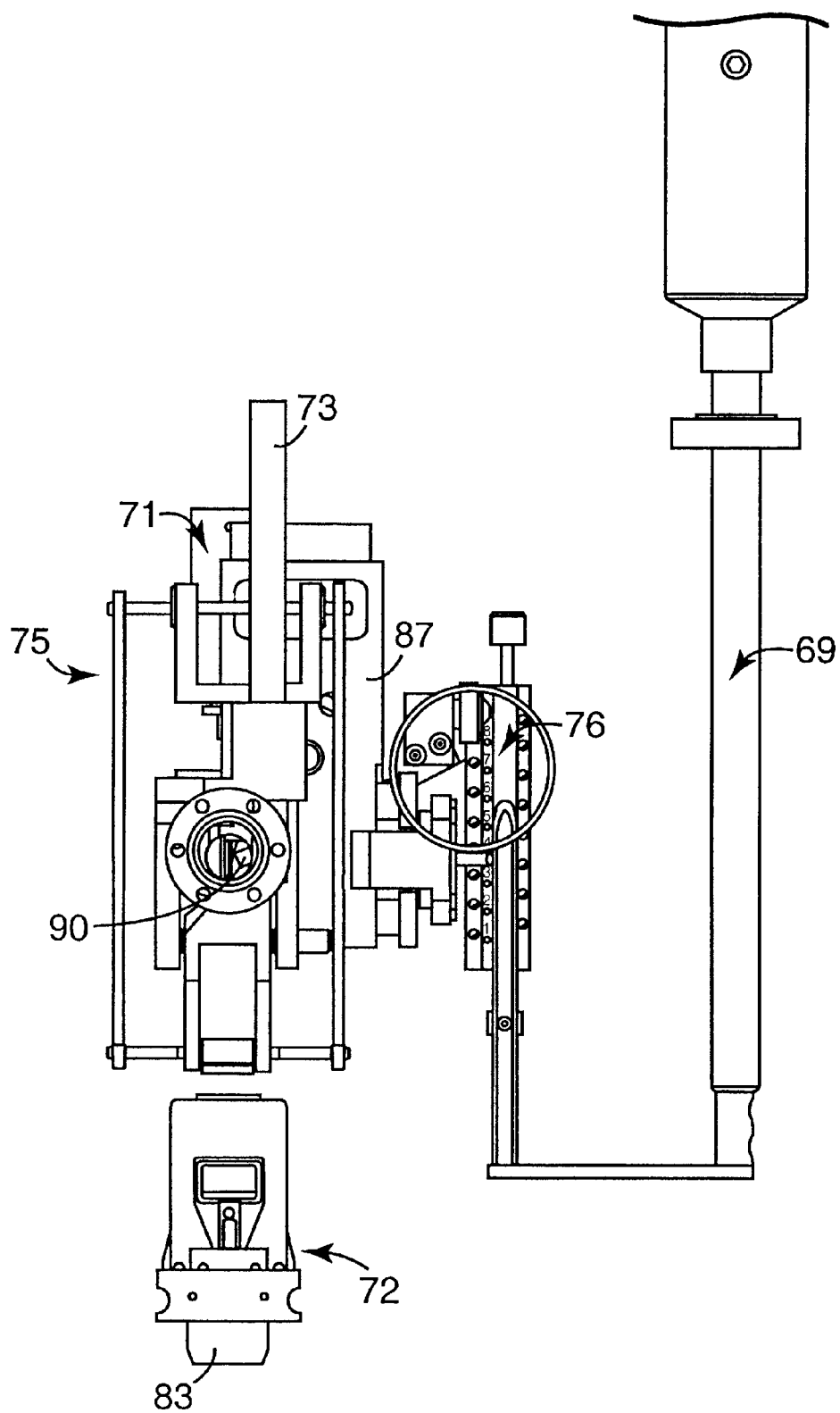
FIG. 8 is a right side view of the supporting and cleaving mechanism of FIGS. 6 and 7.
Figure 9:
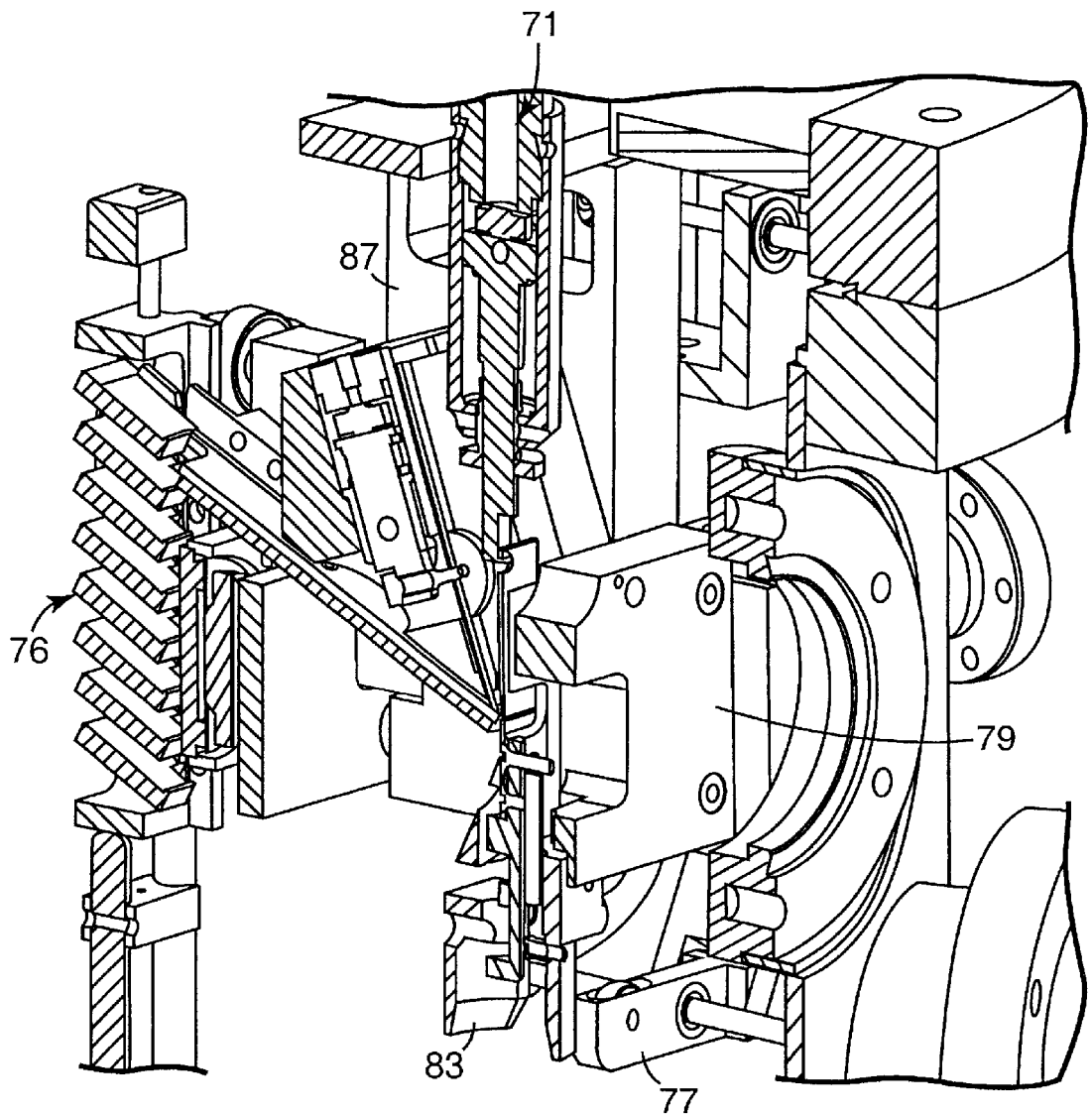
FIG. 9 is an enlarged perspective view in partial cross section of a portion of the supporting and cleaving mechanism of FIG. 6 positioned within the cleaving chamber.
Figure 11:
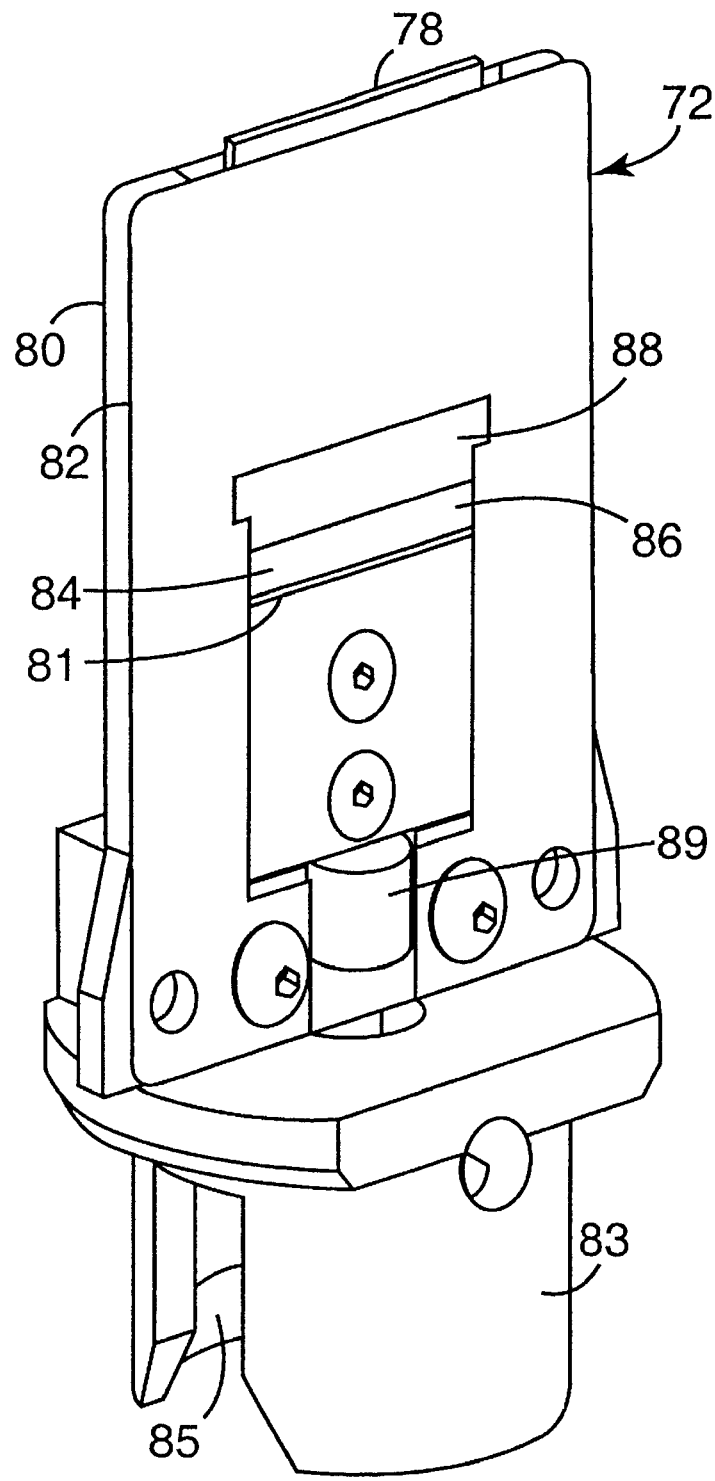
FIG. 11 is a perspective view of an empty cassette and cleave bar in accordance with the present invention.

The preferred embodiment of the invention includes a cleaving mechanism 70, a cassette 72, a cassette tray 74, and a cell tray 76. The arrangement is shown in FIG. 6. A left side view and a right side view is shown in FIGS. 7 and 8, respectively. Cassette 72 is shown in further detail in FIG. 11. The cassette 72 preferably comprises spaced-apart front wall 80 and rear wall 82. Front wall 80 and rear wall 82 have openings 84 and 86 formed therein, respectively. Opening 86, as well as the lower portion of opening 84, have a width that is slightly less than the length of the laser bars. The upper portion of opening 84, which is defined by a shoulder portion 88 of the rear wall, is wider than the lower portion and is wider than the length of the laser bars. Thus, as described in further detail below, the laser bars can be freely inserted into the cassette through the upper portion of opening 84, and then drop down into the cassette. Once the laser bars drop down, the laser bars are held by the shallow slots formed by the front and rear walls in the region of openings 84 and 86. The laser bars land and stack on a cassette shelf 81. In this position, the laser bars are securely held in the cassette, while still exposing a substantial portion of the side surfaces of the laser bars for subsequent coating. Cleave bar 78 is preferably loaded with the cassette as opposed to being permanently mounted inside the cleaving chamber. The cleave bar is shown in the cassette in FIG. 8 and is shown in a position slightly above the cassette shelf 81. In its normal loading position the cleave bar rests directly on the cassette shelf.

Cassette 72 is preferably made of a UHV-clean metal such as Grade 2 titanium or the like , and is preferably dimensioned so that at least 50 laser bars may be held within the cassette.

Figure 12:
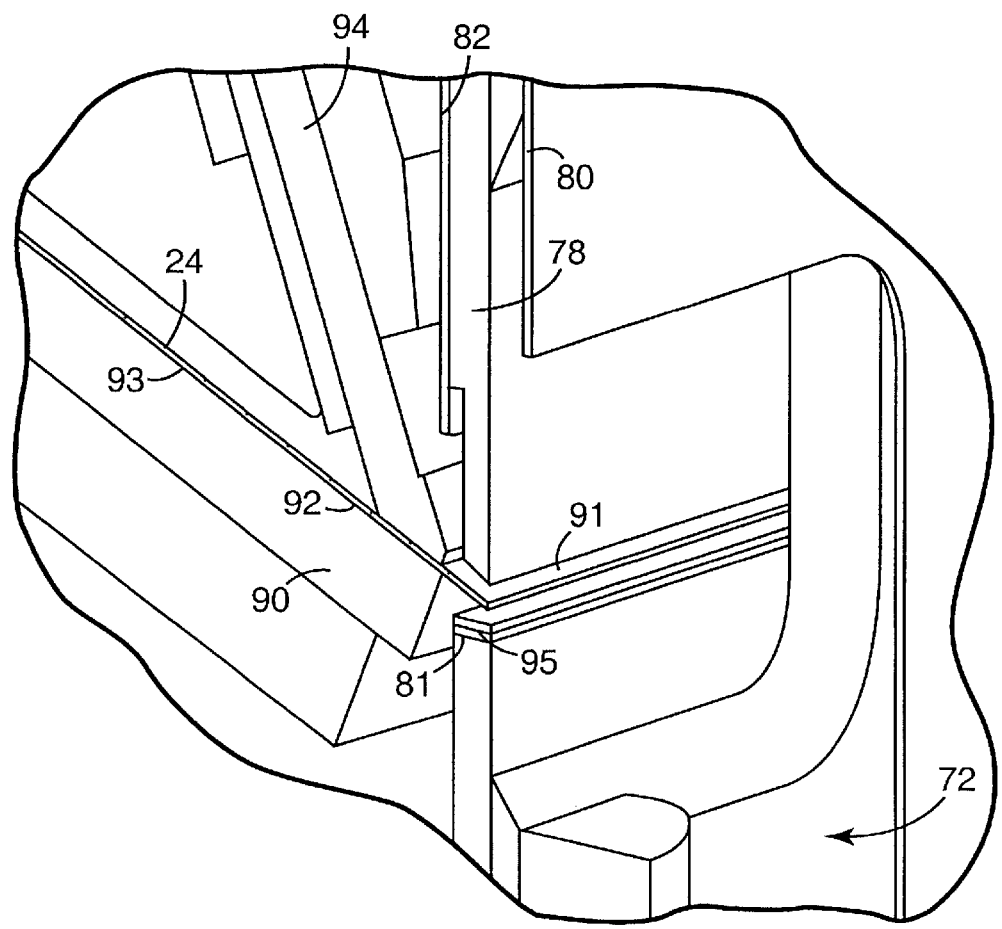
FIG. 12 is an enlarged perspective view and partial cross section of a guide, cell clamp, cleave bar and cassette in accordance with the present invention.
Figure 13:
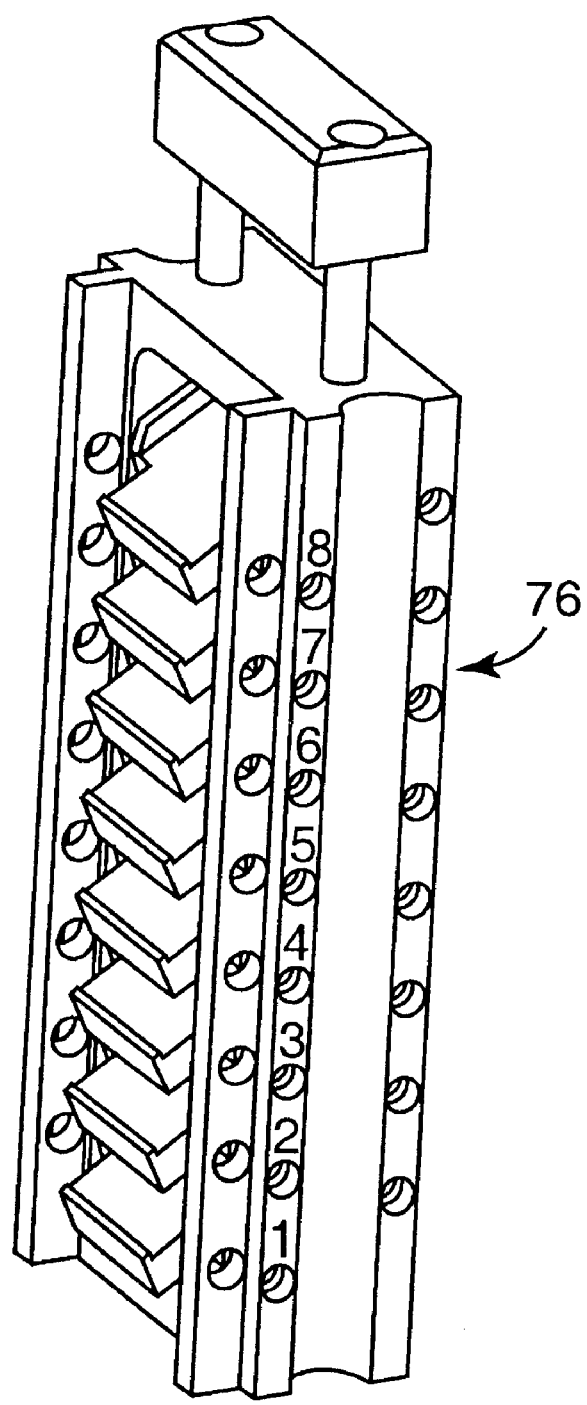
FIG. 13 is a perspective view of an empty cell tray usable in accordance with the present invention.

Referring to FIG. 12, the cleaving mechanism 70 preferably includes an inclined guide 90. The inclined guide 90 has a guide surface 92, which supports a laser cell capable of yielding a plurality of laser bars. A pneumatically actuated cell clamp 94 is mounted within the cleaving chamber such that it clamps the laser cell into place on the inclined guide and preferably rests at an angle of about 45° relative to the guide surface 92. The inclined guide 90 preferably rests at an angle of about 25° relative to a horizontal plane.

Referring to FIGS. 6–12, the cleaving mechanism 70 preferably includes a pneumatically actuated cleave bar 78 which is removable with cassette 72. The cleave bar extends downwardly between the front and rear walls of cassette 72. The upper end of the cleave bar is connected to a pivotable actuator 71 that can move the cleave bar in the vertical direction. The actuator 71 is pivotable for connecting to the cleave bar 78. Actuator 71 is preferably pneumatically operated. Actuation of the cleave bar causes the cleave bar to press against the laser bar located along the edge of the laser cell A linear motion drive 73 mounted on the cleaving chamber 50 has a linkage 75 mounted on a frame 87 within the cleaving chamber with an arm 77 for controlling the position of the cassette shelf 81. Referring to FIG. 8 the cassette 72 also preferably includes an attachment clip 83 formed at the lower end with an opening 85 therein for receiving the arm 77 and for attaching the cassette 72 to a transport arm as described below. A pneumatically actuated cassette clamp 79 is mounted on the frame 87 within the cleaving chamber 50. Once the cassette clamp 79 has been actuated to clamp the cassette to frame 87 arm 77 can be inserted into opening 85.

Cassette 72 also preferably includes an attachment clip 83 formed at the lower end thereof for attaching the cassette 72 to a transport arm 51 (FIG. 5). The transport arm facilitates transfer of the cassette 72 between the cleaving chamber 50 and a deposition chamber 56 for depositing a mirror layer and/or other layers after a plurality of laser bars have been loaded in the cassette.

Figure 10:
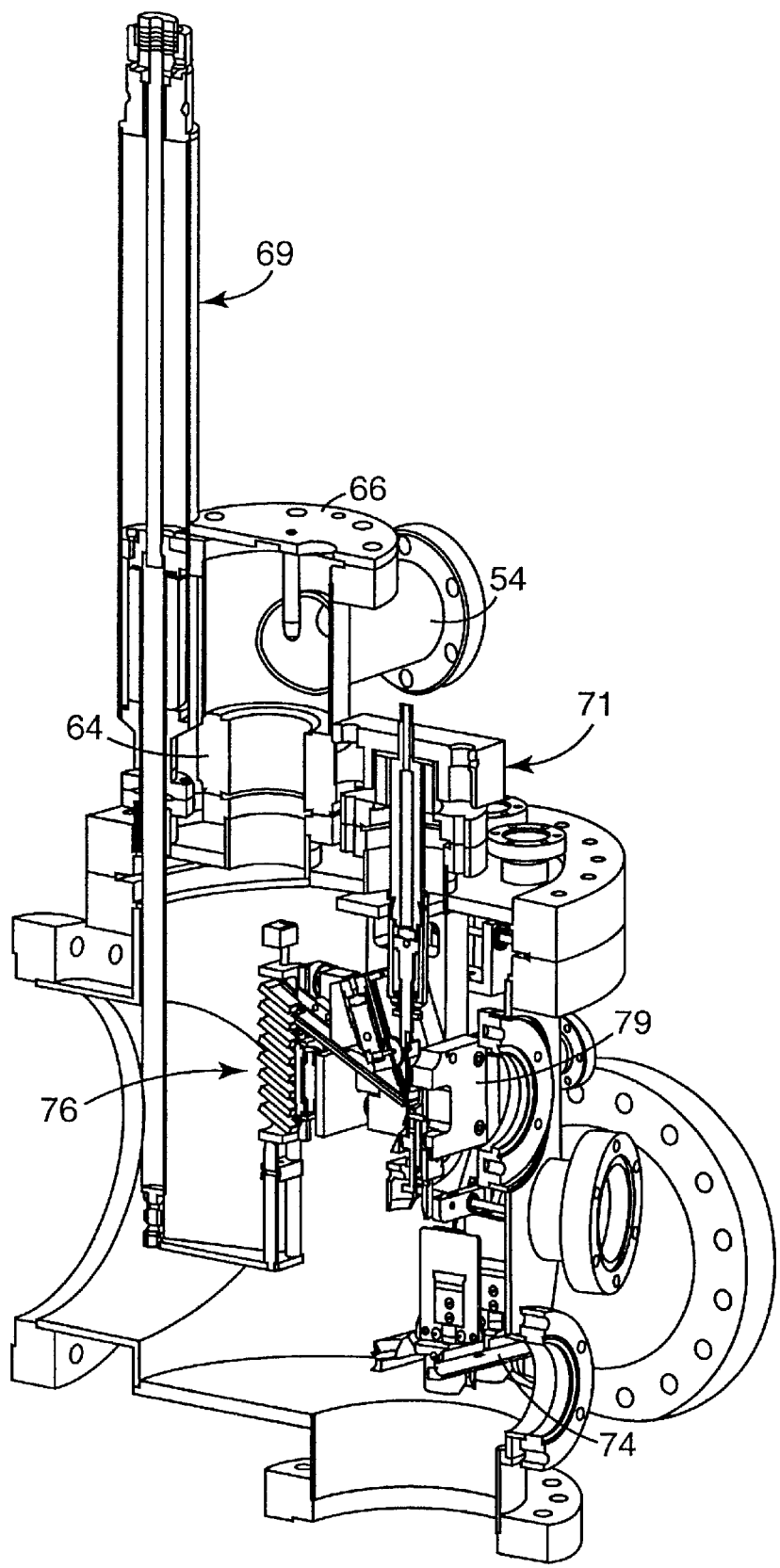
FIG. 10 is a partial cross sectional view of the supporting and cleaving mechanism of FIGS. 6–9 positioned within the cleaving chamber and showing the cell loading chamber, cell tray and cassette tray.
Figure 14:
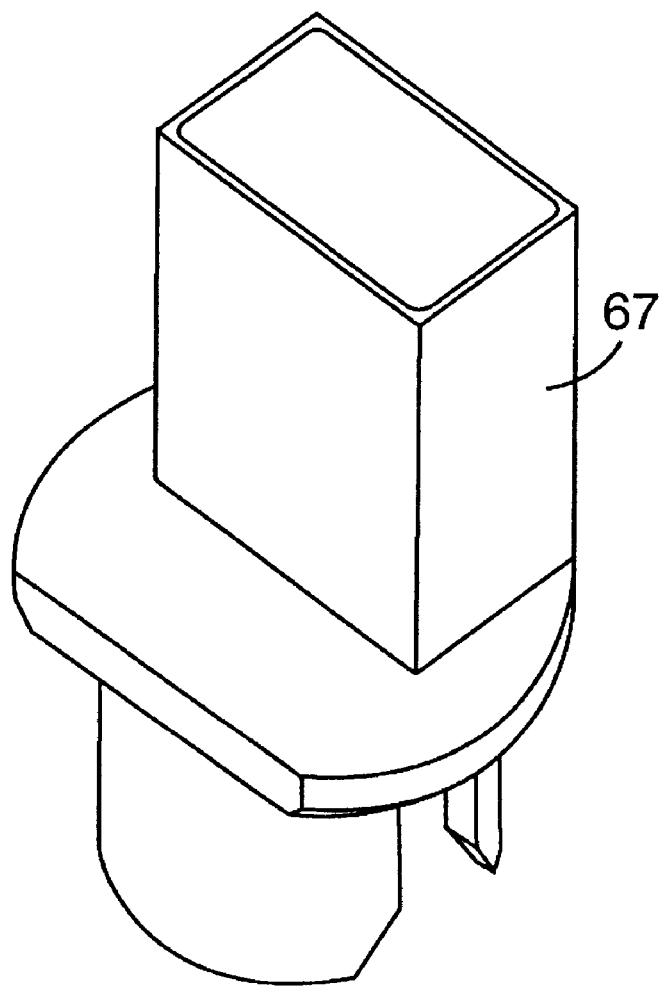
FIG. 14 is a perspective view of a recovery cassette usable in accordance with the apparatus of the present invention.

Referring to FIG. 6, the preferred embodiment of the present invention includes a cassette tray 74. The cassette tray holds multiple cassettes and preferably one recovery cassette 67 (FIG. 14). The recovery cassette 67 is used to recover a laser cell without venting the cleaving chamber. Cassette tray 74 is positioned inside cassette loading chamber 52 via port 62 and is moved to cleaving chamber 50 with transport arm 53. The preferred embodiment also includes a cell tray 76. The cell tray 76 is shown in FIG. 10. Cell tray 76 is positioned inside cell loading chamber 54 via port 66 and is moved to cleaving chamber 50 with transport arm 69.

A preferred method of batch processing laser diodes using the above-described apparatus will now be described. Cleaving chamber 50 is pumped down to UHV pressures, i.e., below $1 \times 10^{-9}$ Torr. Such UHV conditions are achieved to facilitate the production of clean laser end surfaces 29. "Clean surfaces" mean herein surfaces with essentially no (e.g., $\leq 10$ atomic %) oxide or other contaminants. The cleaving chamber 50 is maintained at such UHV conditions throughout continuous operation of the apparatus and is not exposed to atmosphere throughout repeated loadings of the cassette loading chamber 52 and the laser cell loading chamber 54.

Several empty cassettes 72, preferably 4 cassettes, capable of holding a plurality of laser bars, and each containing an integral cleave bar 78, are loaded on a cassette tray 74 along with one recovery cassette 67 and loaded inside the cassette loading chamber 52 via port 62. The cassette loading chamber is pumped to a pressure below $1 \times 10^{-8}$ Torr and is baked at a temperature between 100 and 150 degrees Celsius during the pumping.

Several laser cells 20, preferably 8 laser cells, are loaded on a laser cell tray 76 and loaded inside the laser cell loading chamber 54 via port 66. Preferably, the laser cell 20 has scribe marks 24 on the patterned side of the substrate (i.e., the side that contains the layered structure) delineating the individual laser bars 22. These scribe marks should be parallel to the preferred cleaving directions, as known to those skilled in the art and will not be described further here The cell loading chamber is pumped to a pressure below $1\times10^{-8}$ Torr and is baked at a temperature between 100 and 150 degrees Celsius during the pumping.

Preferably, the pumping of the loaded cassette loading chamber and the loaded cell loading chamber occur at about the same time.

Gate valve 60 is opened and transfer rod 53 is positioned to attach to the cassette tray. Transfer rod 53 is moved such that the attached cassette tray is positioned below cleaving mechanism 70 and gate valve 60 is closed. Preferably the operation of moving the cassette tray from the cassette loading chamber to the cleaving chamber takes not more than 30 seconds. Gate valve 58 is opened and transfer arm 51 is positioned to attach to cassette attachment clip 83. The transfer arm is moved to lift the attached cassette out of the cassette tray and is rotated to align the cassette to the cleaving mechanism 70. At this point cassette clamp 79 is in the open position. Once properly aligned, the transfer arm is moved to position the cassette in the cleaving mechanism and the pneumatically actuated cassette clamp is used to clamp the cassette to the frame 87. The transfer arm 51 is detached from the cassette attachment clip. Pivotable cleave bar actuator 71 is in the pivoted or disengaged position. Linear feedthru 73 is moved to engage linkage 75 and move arm 77 into opening 85 in the cassette. The arm presses against cassette shelf pin 89 and cassette shelf 81 and cleave bar 78 are lifted. The cleave bar actuator is pivoted and the cleave bar is attached to the cleave bar actuator. The cassette shelf is positioned, by moving the arm, to a position to receive a plurality of laser bars. Also, a laser cell is loaded into the inclined guide 90, which is positioned just above the cassette assembly, as shown in FIGS. 12. The laser cell is loaded into the inclined guide by opening gate valve 64 and positioning laser cell tray 76 (using linear feedthru 69) such that a laser cell is passed to the inclined guide. Gravity, due to the inclined position of the guide, provides a forward force on the cell, thereby advancing the cell down the inclined guide 90 until it touches the cassette assembly.

The cleaving process will be described with reference to FIGS. 6 and 12. The laser cell, touching the cassette assembly, is clamped into place using the cell clamp 94. At the same time, the cleave bar 78 is actuated so as to press against an end laser bar 91 located along the lower edge of the laser cell. As explained above, the cassette 72 and inclined guide 90 are configured such that the cleaved laser bar falls directly into the cassette 72 and rests on the cassette shelf 81, as shown in FIG. 12.

The cassette shelf 81 is indexed down using the arm 77, cleave bar 78 and cell clamp 94 are then released, whereupon gravity forces the laser cell 93 forward. The cleaving cycle then repeats until a plurality, preferably at least 2, and more preferably at least 50, of laser bars 95 are cleaved from the laser cell 93 and loaded into the cassette 72.

Once the cassette is loaded with the desired number of laser bars, the cassette 72 is transferred to a deposition chamber 56 using vacuum transfer arm 51. The transfer preferably occurs under UHV conditions, so as to avoid exposing the clean end surfaces of the laser bars to potential atmospheric contamination. Transfer of the cassette under such conditions facilitates the growth of the more preferable single crystal window layers on the laser bar end surfaces. The transfer step may be a simple transfer from the cleaving chamber to the deposition chamber, or may comprise several steps during which the cassette is transferred to one or more intermediary chambers each of which is under vacuum. The use of intermediary vacuum chambers is well known in the art and will not be described in detail here.

Figure 15:
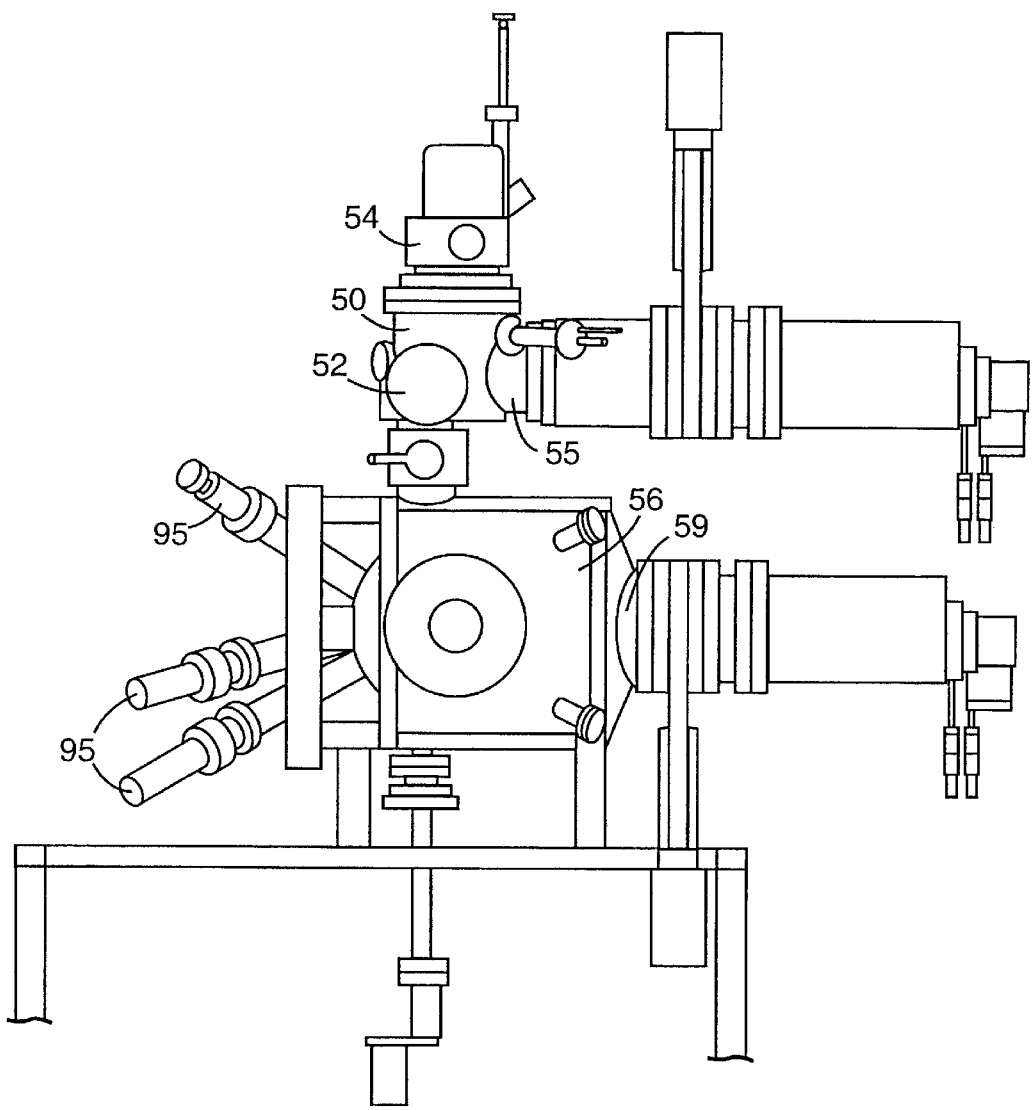
FIG. 15 is a side elevational view of a combination cleaving chamber and deposition chamber in accordance with the present invention.

After transfer of the cassette 72 to the deposition chamber 56, a layer of material is deposited on one or both opposing end surfaces of the plurality of laser bars in the cassette 72. Within the deposition chamber, a cassette holder may be provided to position a cassette therein, and any number of deposition devices (many types of which are well known in the art for deposition), which effusion type sources are illustrated in FIG. 15 at 96. Most preferably, large band gap, single crystal mirror layers are grown epitaxially on the end surfaces of the laser bars in the cassette 72. Such mirror layers are described in further detail in Applicant's U.S. patent application Ser. No. 09/168,600 to McElhinney et al, entitled "Semiconductor Lasers Having Single Crystal High Band Gap Mirror Layers", filed Oct. 8, 1998, the entire disclosure of which is incorporated herein by reference. At this point, the laser bars can be removed from vacuum without concern about contamination of the laser facets. Additional mirror layers may thereafter be applied, using known techniques, so as to adjust the reflectivity of the two surfaces to approximately 5% and 95% respectively.

Figure 16:
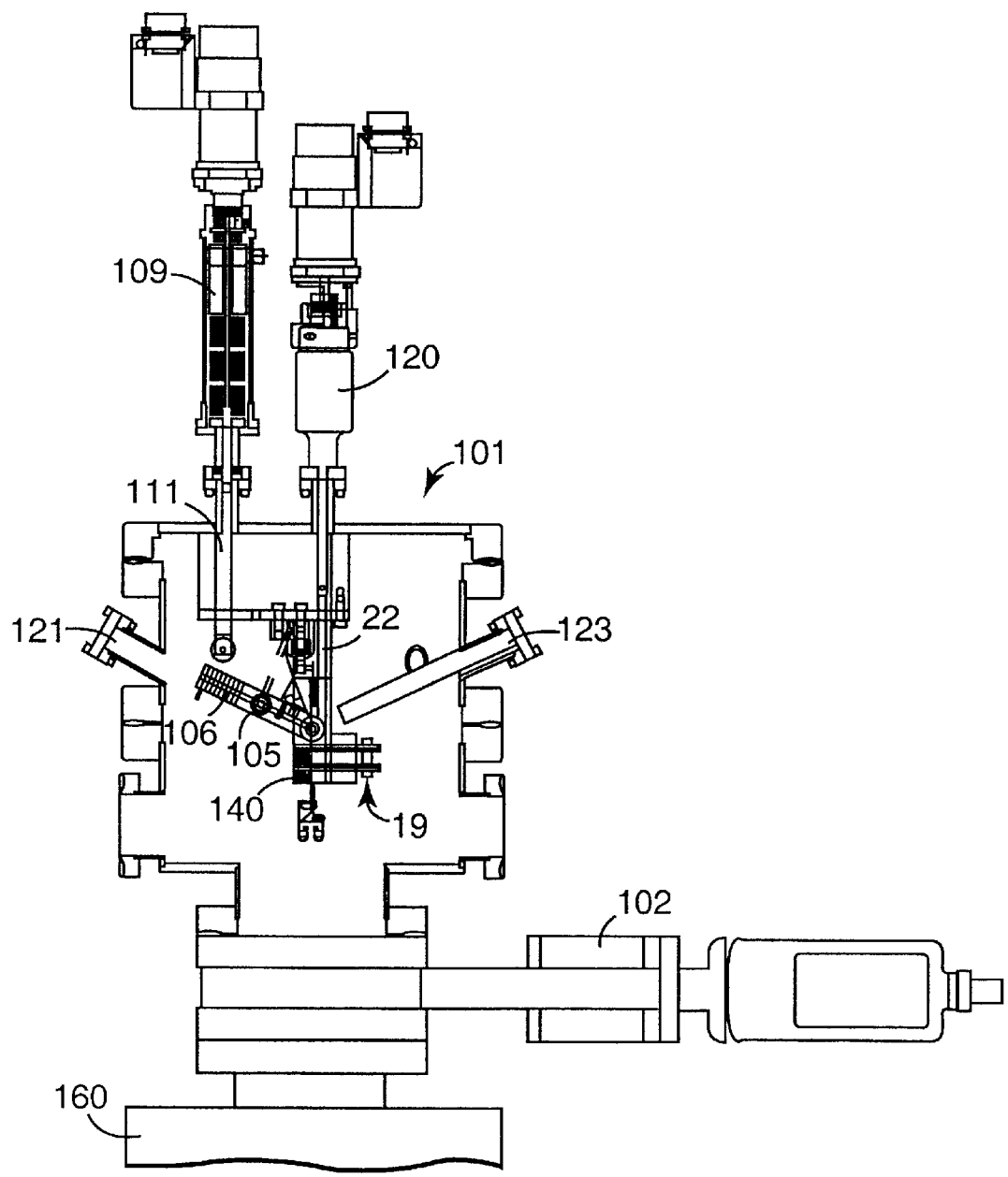
FIG. 16 is another embodiment of an apparatus for batch processing semiconductor lasers according to the present invention in partial cross section.

Another preferred apparatus for cleaving and loading a plurality of laser bars into a cassette for batch processing is shown in FIG. 16. As shown therein, the apparatus includes a UHV compatible cleaving chamber 101. A pump or series of pumps (not shown) are provided to achieve a clean environment (e.g., a pressure below about $1\times10^{-9}$ Torr) for the production of clean, smooth laser pumps comprise oil-free pumps to eliminate back-streaming of oil vapor into the cleaving chamber, such as oil-free cryopumps, magnetic bearing turbo pumps, and ion pumps. The pump is connected to the cleaving chamber 101 via a gate valve 102 to seal off the pump when venting the cleaving chamber 101.

Figure 17:
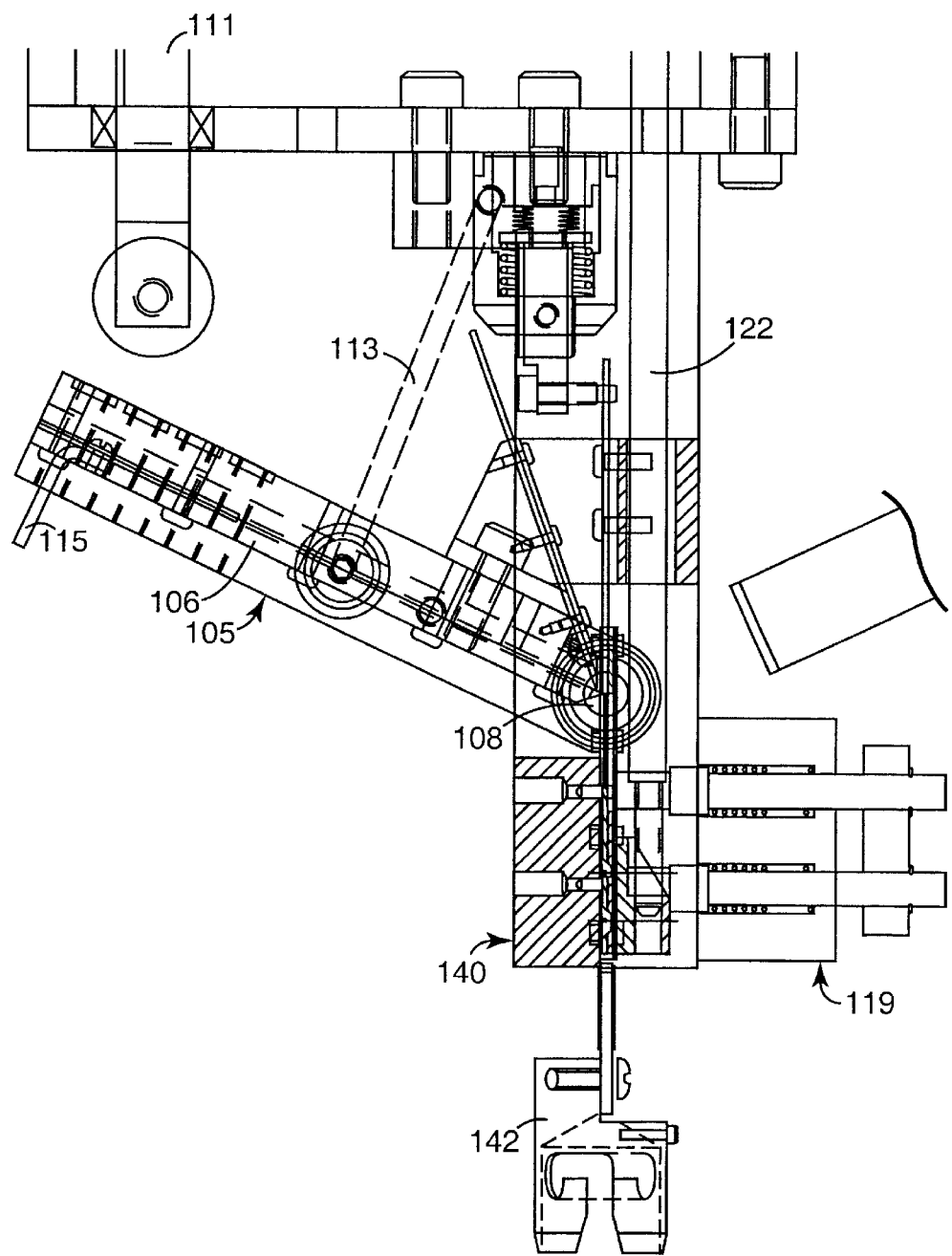
FIG. 17 is a side view of a guide mechanism and cassette assembly in accordance with the embodiment of FIG. 16.

An inclined guide 105, which is capable of pivoting about pivot axis 108, is mounted within the cleaving chamber 101, as shown in FIG. 17. The inclined guide 105 has a guide surface 106 which supports a laser cell capable of yielding a plurality of laser bars. A pneumatically actuated cell clamp 107 is mounted within the cleaving chamber such that it clamps the laser cell into place on the inclined guide. The inclined guide 105 preferably rests at an angle relative to a horizontal plane.

Means are for provided for causing rotation of the inclined guide. Preferably, this means includes a linear motion drive 109 is mounted on the cleaving chamber 101. The linear motion drive is connected to an extendable arm 111. Actuation of the linear motion drive 109 causes the arm to extend downwardly into the cleaving chamber and press against the end of the inclined guide, causing it to rotate. A cell arm return spring 113 may be attached to the inclined guide 105. This return spring 113 returns the inclined guide 105 to its original angle of inclination after a laser bar has been cleaved off the laser cell.

As depicted in FIGS. 16 and 17, an index weight 115 is provided at the upper end of the inclined guide 105. This weight 115 provides a forward force on the laser cell, advancing the cell down the inclined guide 105 to the lower end of the guide 105.

This embodiment of the present invention also includes a cassette 140 for holding a plurality of laser bars. As above, the laser bars can be freely inserted into the cassette through the upper portion thereof, and then drop down into the cassette. Once the laser bars drop down, the laser bars are held by the shallow slots formed by the front and rear walls of the cassette. In this position, the laser bars are securely held in the cassette, while still exposing a substantial portion of the side surfaces of the laser bars for subsequent coating.

A rotary motion drive 120 mounted on the cleaving chamber 101 has an arm 122 for holding and moving the cassette. The cassette 140 has a mounting block 141 with an opening 143 therein for receiving the arm 122. A pneumatically actuated cassette clamp 119 is mounted within the cleaving chamber 101. Once arm 122 has been inserted into opening 143, the cassette clamp 119 can be actuated to clamp the cassette to arm 122.

Cassette 140 also preferably includes an attachment clip 142 formed at the lower end thereof for attaching the cassette 140 to a transport arm. The transport arm facilitates transfer of the cassette 140 between the cleaving chamber 101 and a deposition chamber (described further below) for depositing a mirror layer and/or other layers after a plurality of laser bars have been loaded in the cassette.

Referring again to FIGS. 16 and 17, the apparatus preferably also includes a pneumatically actuated bar clamp 117. The bar clamp extends downwardly between the front and rear walls of cassette 140. The upper end of the bar clamp is connected to an actuator 119 that can move the bar clamp in the vertical direction. Actuator 119 is preferably pneumatically-operated.

Optical access ports 121 and 123 may be provided on opposing sides of the cleaving chamber. Ports 121 and 123 allow one to be apprised of the progress of the cleaving cycle.

In this embodiment, the cleaving chamber 101 is operationally connected to a deposition chamber 160. The specific components that are placed within the deposition chamber are well known to those skilled in the art, and will not be discussed in detail herein. Generally speaking, the deposition chamber may include a cassette holder and a plurality of effusion sources.

A method of batch processing laser diodes using the above-described apparatus will now be described. Cleaving chamber 101 is pumped down to UHV pressures, i.e., below $1 \times 10^{-9}$ Torr. Such UHV conditions are achieved to facilitate the production of clean laser end surfaces. "Clean surfaces" mean herein surfaces with essentially no (e.g., $\leq 10$ atomic %) oxide or other contaminants.

Figure 18:
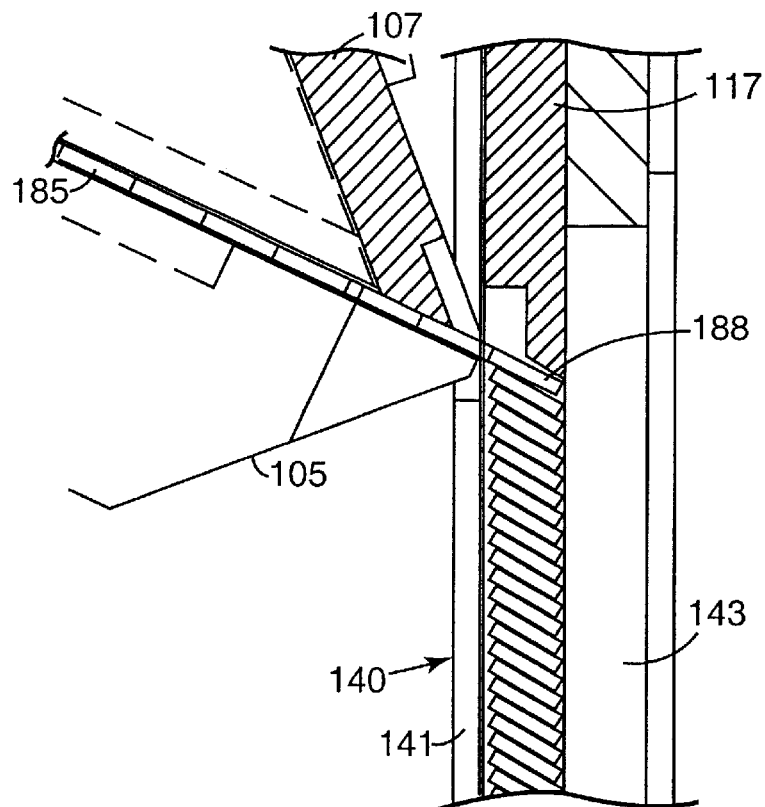
FIG. 18 is an enlarged side view of the guide mechanism and cassette assembly of FIGS. 16 and 17 prior to a cleaving operation.
Figure 19:
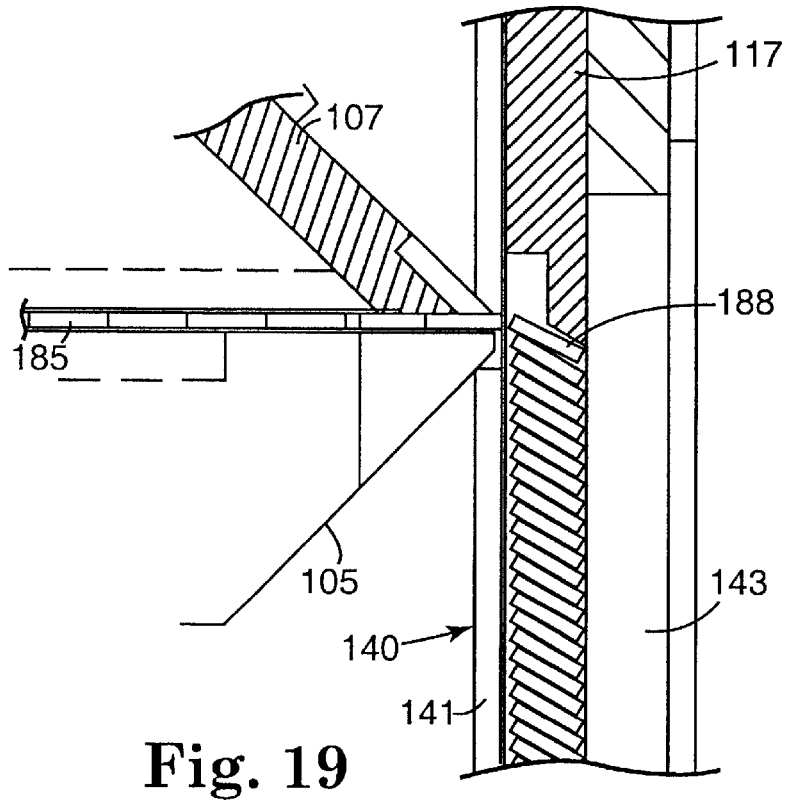
FIG. 19 is an enlarged side view similar to FIG. 18 but showing the position of the guide mechanism after cleaving.

An empty cassette 140 capable of holding a plurality of laser bars is loaded inside the cleaving chamber 101 and clamped to arm 122 using pneumatically actuated cassette clamp 119. Also, a laser cell is loaded into the inclined guide 105, which is positioned just above the cassette assembly, as shown in FIGS. 16 and 17. Preferably, the laser cell 185 has scribe marks on the unpolished exposed side of the substrate (i.e., the side opposite to that supporting the layered structure) delineating the individual laser bars. The spacing between scribe marks are indicated in FIGS. 18 and 19 by dashed lines 186 on the laser cell 185. It is understood, however, that the scribe marks are actually perpendicular to the cross-section depicted in FIGS. 18 and 19. These scribe marks should be parallel to the preferred cleaving directions, as known to those skilled in the art. Methods for producing the scribe marks are known to those skilled in the art and will not be described further here.

The cleaving process will be described with reference to FIGS. 18 and 19. The index weight 115 is located behind the laser cell to provide a forward force on the cell, thereby advancing the cell down the inclined guide 105 until it touches the cassette assembly. The laser cell is then clamped into place using the cell clamp 107. At the same time, the bar clamp 117 is actuated so as to press against an end laser bar 188 located along the lower edge of the laser cell. Linear motion drive 109 is then actuated so that actuating arm 111 causes the inclined guide 105 to rotate. Rotation of the inclined guide causes laser bar 188 to be cleaved from the remainder of laser cell 185. As explained above, the cassette 140 and inclined guide 105 are configured such that the cleaved laser bar falls directly into the cassette 140, as shown in FIG. 19.

The cassette 140 is then indexed down using the bar indexing rotary motion drive 120. Upon retraction of actuating arm 111, spring mechanism 113 returns the laser cell 185 to its original angle of inclination. Cell clamp 107 and bar clamp 117 are then released, whereupon index weight 115 forces the laser cell 185 forward. The cleaving cycle then repeats until a plurality, preferably at least 15, of laser bars 190 are cleaved from the laser cell 185 and loaded into the cassette 140.

Once the cassette is loaded with the desired number of laser bars, the cassette 140 is transferred to a deposition chamber 150 using a vacuum transfer arm. The transfer preferably occurs under UHV conditions, so as to avoid exposing the clean end surfaces of the laser bars to potential atmospheric contamination. Transfer of the cassette under such conditions facilitates the growth of the more preferable single crystal window layers on the laser bar end surfaces. The transfer step may be a simple transfer from the cleaving chamber to the deposition chamber, or may comprise several steps during which the cassette is transferred to one or more intermediary chambers (not shown), each of which is under vacuum. The use of intermediary vacuum chambers is well known in the art and will not be described in detail here.

After transfer of the cassette 140 to the deposition chamber 160, a layer of material is deposited on one or both opposing end surfaces of the plurality of laser bars in the cassette 140. Most preferably, large band gap, single crystal mirror layers are grown epitaxially on the end surfaces of the laser bars in the cassette 140. At this point, the laser bars can be removed from vacuum without concern about contamination of the laser facets. Additional mirror layers may thereafter be applied, using known techniques, so as to adjust the reflectivity of the two surfaces to approximately 5% and 95%, respectively.

The present invention is not limited to the above-described preferred apparatus and method. More generally, the invention embraces cleaving of a plurality of laser bars in vacuum and loading the laser bars into a cassette, to facilitate the simultaneous coating of a plurality of laser bars. Furthermore, it should be understood that, while particular embodiments of the invention have been discussed, this invention is not limited thereto as modifications may be made by those skilled in the art, particularly in light of the foregoing teachings. Accordingly, the appended claims contemplate coverage of any such modifications as incorporate the essential features of these improvements within the true spirit and scope of the invention.

We claim:

1. An apparatus for batch processing semiconductor laser substrates, the semiconductor lasers being formed from laser bars that are cleaved from a laser cell, each of said laser bars having opposing side surfaces comprising:

a vacuum chamber and a pump for reducing the pressure in the vacuum chamber to a desired level;

a support structure mounted within the vacuum chamber for supporting a laser cell thereon;

a laser bar clamp mounted within the vacuum chamber, said laser bar clamp being positionable so as to hold a laser bar located along an edge of the laser cell;

an actuating arm mounted within the vacuum chamber, said actuating arm being movable so as to cause the support structure to rotate relative to the laser bar clamp, thereby causing said laser bar located along the edge of the laser cell to be cleaved from the laser cell;

a cassette capable of receiving a plurality of laser bars cleaved from the laser cell and holding the laser bars such that at least one of the side surfaces of each of the laser bars is substantially exposed;

at least one deposition source for depositing a layer of material simultaneously on said at least one exposed side surface of the laser bars.

2. The apparatus of claim 1, wherein said at least one deposition source is located in a deposition chamber located adjacent to said vacuum chamber, said apparatus further comprising a transfer arm which, after the cassette has been filled with laser bars, moves the cassette into the deposition chamber.

3. The apparatus of claim 1, wherein said pump reduces the vacuum chamber pressure to below $1 \times 10^{-6}$ Torr.

4. The apparatus of claim 1, wherein said cassette holds the laser bars such that both side surfaces of each of the laser bars are substantially exposed.

5. The apparatus of claim 4, wherein said cassette comprises shallow slots for retaining edge portions of the laser bars while maintaining a substantial fraction of the side surfaces of the lasers bars exposed for depositing material thereon.

6. The apparatus of claim 1, further comprising a laser cell clamp mounted within a vacuum chamber, said laser cell clamp being positionable so as to hold the laser cell against the support structure during rotation of the support structure.

7. The apparatus of claim 6, wherein said laser cell clamp and said laser clamp are pneumatically actuated.

8. The apparatus of claim 1, further comprising a cassette clamp for releasably holding the cassette within the vacuum chamber.

9. The apparatus of claim 1, wherein said support structure comprises an inclined guide, wherein said cassette is mounted below the inclined guide such that the cleaved laser bars are gravitationally loaded into the cassette.

10. The apparatus of claim 9, wherein said support structure further comprises an index weight placed behind the laser cell to advance the laser cell down the inclined guide.

11. The apparatus of claim 9, wherein said support structure further comprises a spring mechanism which biases the laser cell to its original position so that the laser cell returns to its original position after rotation by said actuating arm.

12. An apparatus for batch processing semiconductor lasers, the semiconductor lasers being formed from laser bars that are cleaved from a laser cell, each of said laser bars having opposing side surfaces comprising:

a vacuum chamber and vacuum generator for reducing the pressure in the vacuum chamber to a desired level;

support means within the vacuum chamber for supporting a laser cell thereon;

cleaving means for repeatedly cleaving laser bars from the laser cell;

a cassette capable of receiving a plurality of laser bars cleaved from the laser cell and holding the laser bars such that at least one of the side surfaces of each of the laser bars is substantially exposed;

means for depositing a layer of material simultaneously on said at least one exposed side surface of the laser bars.

13. The apparatus of claim 12, wherein said cleaving means comprises cell clamping means for selectively holding the laser cell on the support means and bar clamping means for selectively holding a laser bar located along an edge of the laser cell.

14. The apparatus of claim 13, wherein said cleaving means further comprises means for rotating the support means relative to the bar clamping means, thereby causing said laser bar located along the edge of the laser cell to be cleaved from the laser cell.

15. The apparatus of claim 14, wherein the cleaving means further comprises biasing means for biasing the support means to its original position so that the support means returns to its original position after rotation by the rotating means.

16. The apparatus of claim 13, wherein said cell clamping means and bar clamping means are pneumatically actuated.

17. The apparatus of claim 13, wherein said support means comprises an inclined guide, wherein said cassette is mounted below the inclined guide such that the cleaved laser bars are gravitationally loaded into the cassette.

18. The apparatus of claim 17, wherein said support means further comprises an index weight placed behind the laser cell to advance the laser cell down the inclined guide.

19. The apparatus of claim 13, wherein said cell clamping means and bar clamping means comprise clamping arms that can be pressed against the laser cell and the laser bar located along the edge of the laser cell, respectively.

20. The apparatus of claim 12, further comprising a deposition chamber located adjacent to the vacuum chamber, said means for depositing being located in said deposition chamber, said apparatus further comprising transfer means for transferring the cassette from the vacuum chamber to the deposition chamber after the cassette has been filled with laser bars.

21. The apparatus of claim 12, wherein said cassette holds the laser bars such that both side surfaces of each of the laser bars are substantially exposed.

22. The apparatus of claim 21, wherein said cassette comprises shallow slots for retaining edge portions of the laser bars while maintaining a substantial fraction of the side surfaces of the lasers bars exposed for depositing material thereon.

23. The apparatus of claim 12, further comprising cassette clamping means for releasably holding the cassette within the vacuum chamber.

* * * * *

UNITED STATES PATENT AND TRADEMARK OFFICE
CERTIFICATE OF CORRECTION

PATENT NO. : 6,451,120 B1  Page 1 of 1
DATED : September 17, 2002
INVENTOR(S) : Hubbard et al.

It is certified that error appears in the above-identified patent and that said Letters Patent is hereby corrected as shown below:

<u>Column 15,</u>
Line 40, "laser clamp" should be -- laser bar clamp --.

Signed and Sealed this

Twenty-eighth Day of January, 2003

JAMES E. ROGAN
*Director of the United States Patent and Trademark Office*